(12) United States Patent
Yee

(10) Patent No.: US 11,355,727 B2
(45) Date of Patent: Jun. 7, 2022

(54) ELECTRONIC APPARATUS HAVING COVER PATTERN LINED OPENINGS

(71) Applicant: SAMSUNG DISPLAY CO., LTD., Yongin-si (KR)

(72) Inventor: Dong-Su Yee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 17 days.

(21) Appl. No.: 16/855,735

(22) Filed: Apr. 22, 2020

(65) Prior Publication Data

US 2021/0005836 A1 Jan. 7, 2021

(30) Foreign Application Priority Data

Jul. 2, 2019 (KR) ..................... 10-2019-0079390

(51) Int. Cl.
| | | |
|---|---|---|
| *H01L 51/00* | (2006.01) | |
| *H01L 51/52* | (2006.01) | |
| *H01L 27/32* | (2006.01) | |
| *G02F 1/133* | (2006.01) | |
| *H01L 51/56* | (2006.01) | |
| *G02F 1/1335* | (2006.01) | |

(52) U.S. Cl.
CPC .......... *H01L 51/524* (2013.01); *H01L 27/323* (2013.01); *H01L 27/3244* (2013.01); *H01L 51/0096* (2013.01); *H01L 51/5253* (2013.01); *H01L 51/5281* (2013.01); *H01L 51/56* (2013.01); *G02F 1/133528* (2013.01); *H01L 27/3272* (2013.01); *H01L 51/5246* (2013.01); *H01L 51/5284* (2013.01); *H01L 51/5293* (2013.01)

(58) Field of Classification Search
CPC .............. H01L 51/524; H01L 51/0096; H01L 51/5253; H01L 51/5281; H01L 27/323; H01L 51/5246; H01L 51/5284; H01L 51/5293; H01L 27/3272; G02F 1/133528
See application file for complete search history.

(56) References Cited

U.S. PATENT DOCUMENTS

| | | | |
|---|---|---|---|
| 7,630,122 B2 | 12/2009 | Uchida | |
| 7,656,471 B2 | 2/2010 | Ota et al. | |
| 8,581,865 B2 | 11/2013 | Choo et al. | |
| 8,947,627 B2 * | 2/2015 | Rappoport | G06F 1/1698 349/151 |
| 9,640,681 B2 | 5/2017 | Min | |
| 9,785,032 B2 | 10/2017 | Chiang et al. | |
| 10,399,298 B2 * | 9/2019 | Yee | B32B 27/281 |
| 10,659,583 B2 * | 5/2020 | Lee | G06F 1/1637 |
| 10,862,068 B2 * | 12/2020 | Choi | H01L 51/5253 |
| 2019/0288047 A1 * | 9/2019 | Jeong | H01L 51/5256 |

(Continued)

FOREIGN PATENT DOCUMENTS

| | | |
|---|---|---|
| KR | 10-1337264 | 11/2013 |
| KR | 10-2013-0131017 | 12/2013 |

*Primary Examiner* — Ida M Soward
(74) *Attorney, Agent, or Firm* — F. Chau & Associates, LLC

(57) ABSTRACT

An electronic apparatus includes a window, a display module that includes a module hole, an optical member disposed between the window and the display module and in which a first opening that overlaps the module hole is formed, and a cover pattern disposed on an inner surface of the first opening of the optical member.

18 Claims, 17 Drawing Sheets

(56) References Cited

U.S. PATENT DOCUMENTS

| | | | |
|---|---|---|---|
| 2020/0161582 A1* | 5/2020 | Choi | G06F 3/042 |
| 2020/0274959 A1* | 8/2020 | Lee | H01L 51/56 |
| 2021/0072588 A1* | 3/2021 | Tang | G06F 1/1626 |
| 2021/0208761 A1* | 7/2021 | Park | G06F 3/044 |
| 2021/0234122 A1* | 7/2021 | Choi | H01L 51/5253 |

* cited by examiner

ELECTRONIC APPARATUS HAVING COVER PATTERN LINED OPENINGS

CROSS-REFERENCE TO RELATED APPLICATIONS

This U.S. non-provisional patent application claims priority under 35 U.S.C. § 119 from, and the benefit of, Korean Patent Application No. 10-2019-0079390, filed on Jul. 2, 2019 in the Korean Intellectual Property Office, the contents of which are herein incorporated by reference in their entirety.

BACKGROUND

Embodiments of the present disclosure herein are directed to an electronic apparatus, and more particularly, to an electronic apparatus in which a through-hole is formed and that senses an external input.

Electronic apparatuses are activated according to an electrical signal. Such an electronic apparatus is constituted by various electronic components such as a display module and an electronic module. The display module includes a display panel that displays an image and a sensing sensor that senses an external input. The electronic components are electrically connected to each other by signal lines, which are variously arranged.

SUMMARY

Embodiments of the present disclosure provide an electronic apparatus that has improved reliability.

An embodiment of the inventive concept provides an electronic apparatus, including: a window; a display module that includes a module hole; an optical member disposed between the window and the display module and in which a first opening that overlaps the module hole is formed, and a cover pattern disposed on an inner surface of the first opening of the optical member.

In an embodiment, the display module includes: a base substrate; a circuit element layer disposed on the base substrate, where the circuit element layer includes a transistor; a display element layer disposed on the circuit element layer, where the display element layer includes a light emitting element connected to the transistor; an encapsulation layer that covers the display element layer; and a sensing sensor disposed on the encapsulation layer, where the sensing sensor includes sensing electrodes spaced apart from each other.

In an embodiment, the module hole is formed by a second opening that passes through the display module.

In an embodiment, the cover pattern covers an inner surface of the second opening of the display module.

In an embodiment, the cover pattern is not disposed on an inner surface of the second opening of the display module.

In an embodiment, a panel opening that passes through at least one of the circuit element layer or the display element layer is formed in the display module, the module hole is formed by the panel opening, and the encapsulation layer overlaps the panel opening.

In an embodiment, the electronic apparatus further includes an adhesion layer disposed between the window and the optical member.

In an embodiment, a third opening that overlaps the module hole and passes through the adhesion layer is formed in the adhesion layer, and the cover pattern extends to an inner surface of the third opening of the adhesion layer.

In an embodiment, the window includes a base window and a bezel pattern, the base window includes a bezel area on which the bezel pattern is disposed, a transmission area that overlaps the module hole, and an active area that surrounds the transmission area and is adjacent to the bezel area, where the active area transmits therethrough an image generated in the display module.

In an embodiment, the adhesion layer contacts the base window in the transmission area and the active area, and the adhesion layer contacts the bezel pattern in the bezel area.

In an embodiment, a plurality of first openings and cover patterns are provided.

In an embodiment of the inventive concept, an electronic apparatus includes: a window; an optical member disposed below the window and in which a first opening is formed; a display module disposed below the optical member and in which a second opening that overlaps the first opening is formed, and a cover pattern disposed on at least one of a first inner surface of the first opening of the optical member or a second inner surface of the second opening of the display module.

In an embodiment, the electronic apparatus further includes an adhesion layer disposed between the window and the optical member.

In an embodiment, a third opening that overlaps the second opening and passes through the adhesion layer is formed in the adhesion layer, and the cover pattern extends to an inner surface of the third opening of the adhesion layer.

In an embodiment, the window includes a base window and a bezel pattern, the base window includes a bezel area on which the bezel pattern is disposed, a transmission area that overlaps the second opening, and an active area that surrounds the transmission area and is adjacent to the bezel area, where the active area transmits therethrough an image generated in the display module.

In an embodiment, the adhesion layer contacts the base window in the transmission area and the active area, and the adhesion layer contacts the bezel pattern in the bezel area.

In an embodiment, the cover pattern has one of a circular shape, an oval shape, or a polygonal shape.

In an embodiment, the cover pattern is black.

In an embodiment of the inventive concept, a method for manufacturing an electronic apparatus includes: providing a preliminary display module that includes a module hole area and a preliminary optical member formed on the preliminary display module; forming an opening that overlaps the module hole area and passes through the preliminary display module from the preliminary optical member to form a display module and an optical member; and forming a cover pattern on an inner surface of the opening.

In an embodiment, forming the cover pattern includes: applying a light blocking material to the inner surface of the opening; and curing the light blocking material, wherein applying the light blocking material and curing the light blocking material are performed by a same process.

BRIEF DESCRIPTION OF THE DRAWINGS

FIGS. 10A to 1E are cross-sectional views that illustrate a method for manufacturing an electronic apparatus according to an embodiment of the inventive concept.

DETAILED DESCRIPTION

Figure 1A:
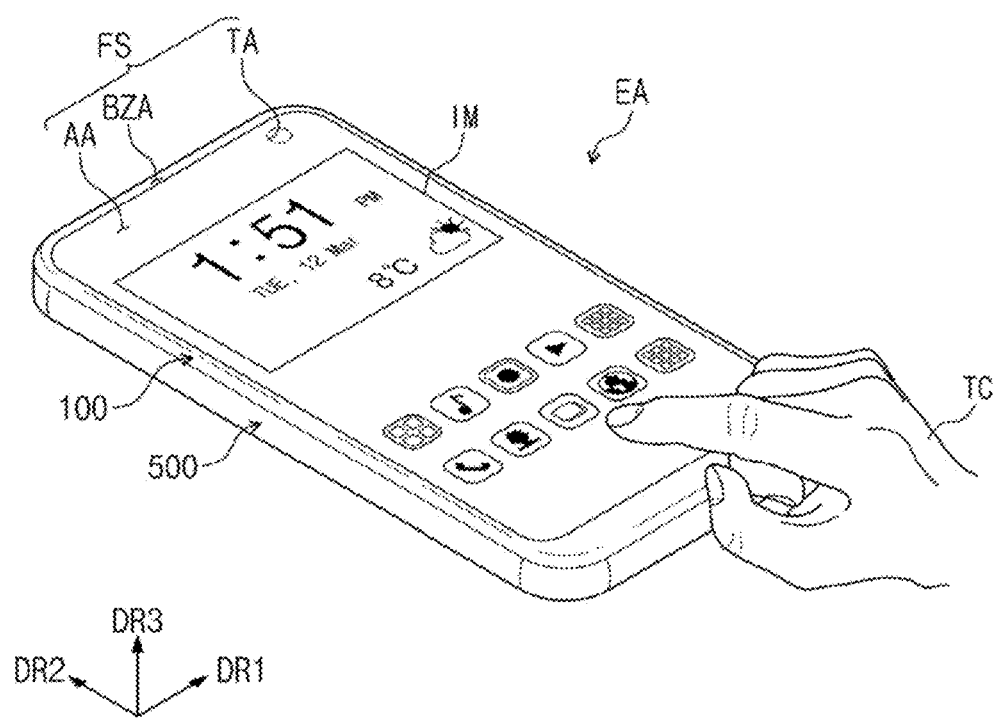
FIG. 1A is a perspective view of an electronic apparatus according to an embodiment of the inventive concept.

In this specification, it will also be understood that when one component (or region, layer, portion, etc.) is referred to as being 'on', 'connected to', or 'coupled to' another component, it can be directly disposed/connected/coupled on/to the one component, or an intervening third component may also be present.

Like reference numerals may refer to like elements throughout. In addition, in the figures, the thickness, ratio, and dimensions of components may be exaggerated for clarity of illustration.

Hereinafter, exemplary embodiments of the inventive concept will be described with reference to the accompanying drawings.

Figure 1B:
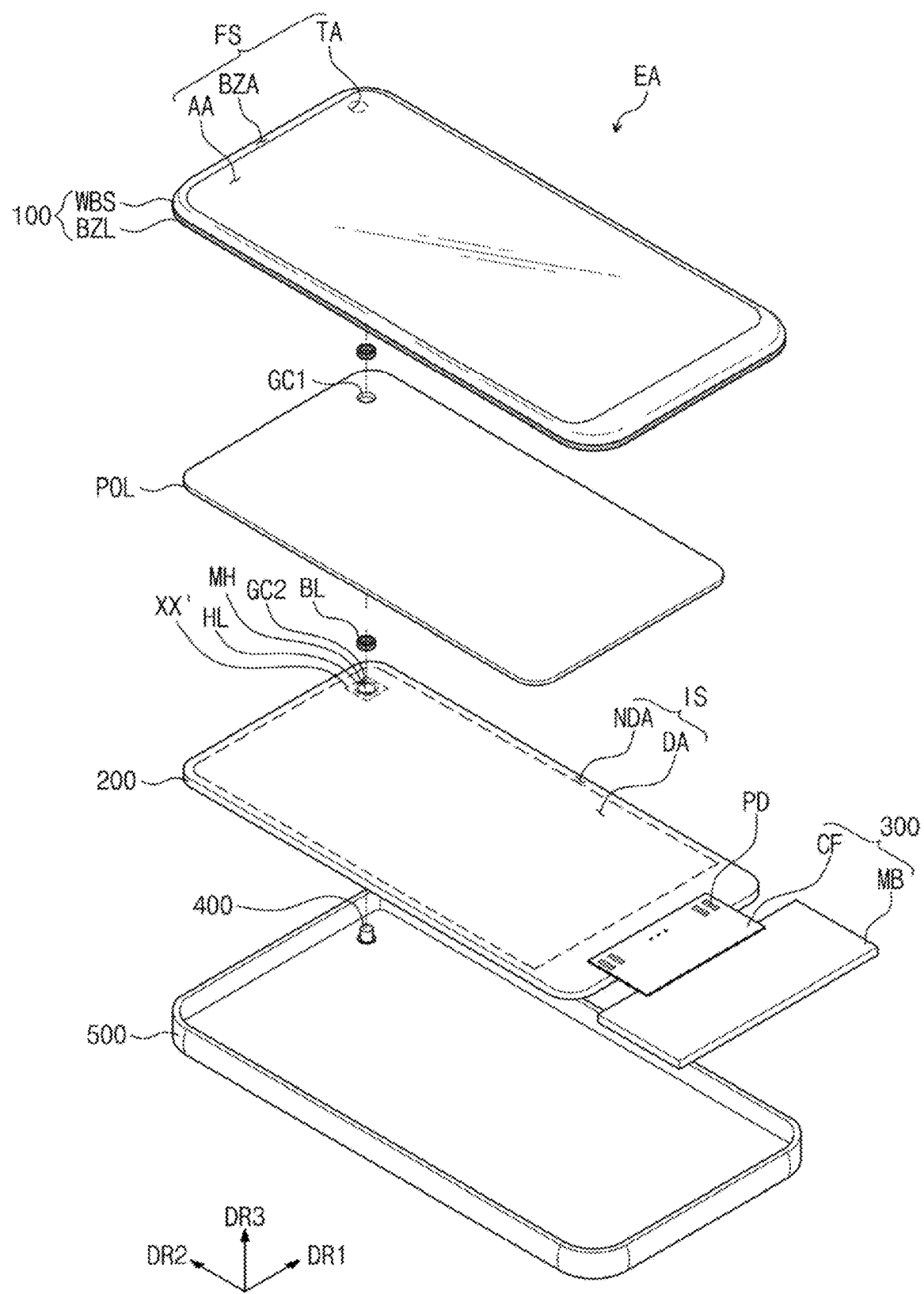
FIG. 1B is an exploded perspective view of an electronic apparatus of FIG. 1A.
Figure 2:
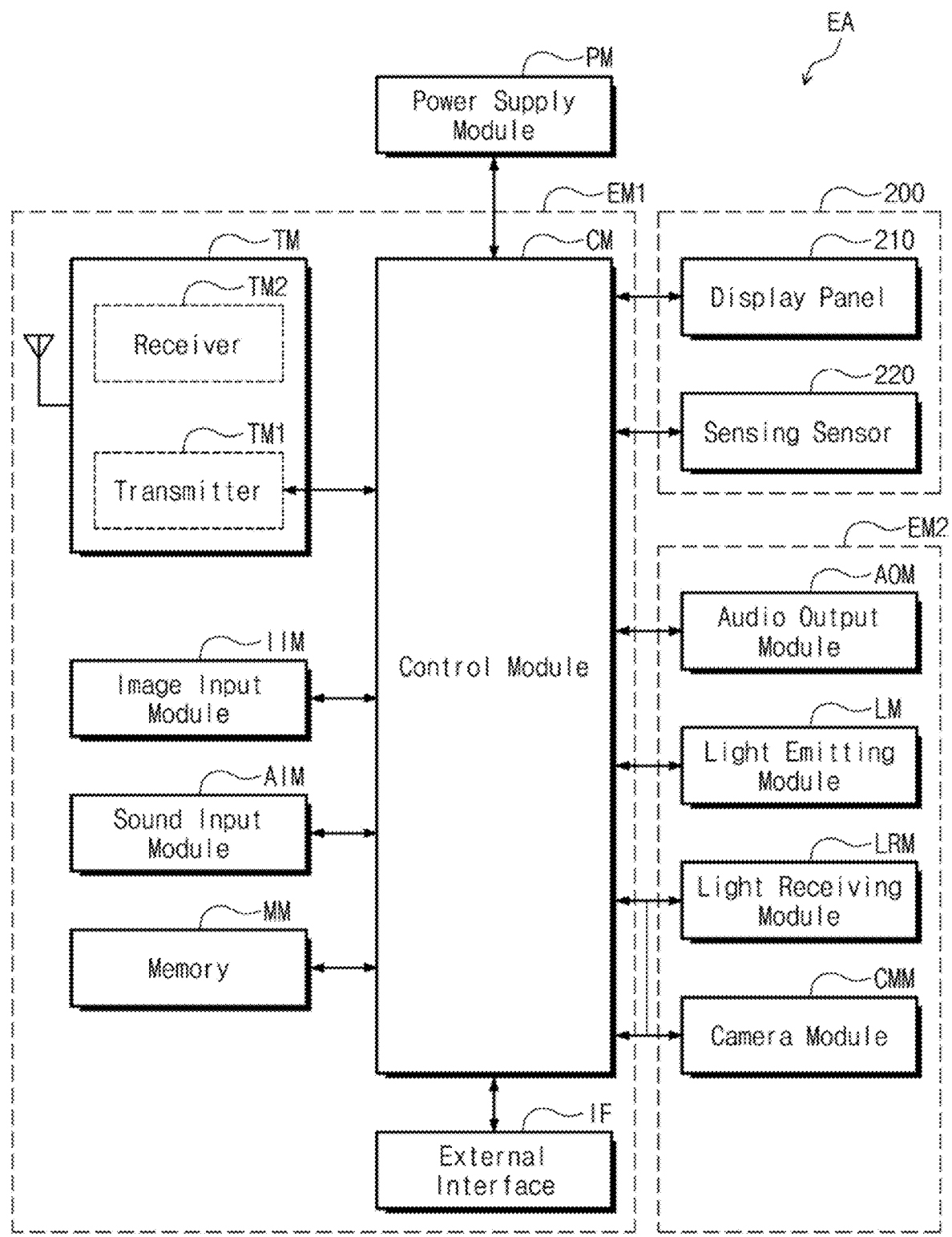
FIG. 2 is a block diagram of an electronic apparatus of FIG. 1A.

FIG. 1A is a perspective view of an electronic apparatus EA according to an embodiment of the inventive concept. FIG. 1B is an exploded perspective view of an electronic apparatus of FIG. 1A. FIG. 2 is a block diagram of an electronic apparatus of FIG. 1A.

An electronic apparatus EA is activated according to an electrical signal. According to an embodiment, the electronic apparatus EA may be one of various examples. For example, the electronic apparatus EA may be a tablet, a notebook, a computer, or a smart television, etc. In an embodiment, an electronic apparatus EA that is a smart phone will be described as an example.

Referring to FIG. 1, according to an embodiment, an electronic apparatus EA displays an image IM through a front surface FS. The front surface FS is parallel to a plane defined by a first direction DR1 and a second direction DR2. The front surface FS includes an active area AA, a transmission area TA, and a bezel area BZA.

According to an embodiment, the electronic apparatus EA displays the image IM on the active area AA. The image IM may be at least one of a static image or a moving image. In FIG. 1, the image IM is shown as a clock and a plurality of icons as an example.

According to an embodiment, the active area AA has a rectangular shape that is parallel to the first direction DR1 and the second direction DR2 and has respective curved edges. However, this is merely an example, and embodiments are not limited thereto. For example, the active area AA may have various other shapes in other embodiments.

According to an embodiment, the bezel area BZA is adjacent to the active area AA. The bezel area BZA surrounds the active area AA. However, this is merely an example, and embodiments are not limited thereto. For example, in other embodiment, the bezel area BZA may be disposed adjacent to only one side of the active area AA or may be omitted. The electronic apparatus EA according to an embodiment of the inventive concept may be one of various examples, but is not limited to a specific embodiment.

The transmission area TA according to an embodiment is disposed within the active area AA and surrounded by the active area AA. The transmission area TA is surrounded by one side of the active area AA and one side of the bezel area BZA. In addition, although the transmission area TA is disposed on a right upper end of the front surface FS, embodiments of the inventive concept are not limited thereto. For example, in other embodiments, the transmission area TA may be disposed in various other positions based on an arrangement and shape of an electronic module 400 that will be described below.

According to an embodiment, a normal direction of the front surface FS corresponds to a thickness direction, hereinafter, referred to as a third direction, of the electronic apparatus EA. In an embodiment, a front (or top) surface or a rear (or bottom) surface of each of members can be defined based on a direction in which the image IM is displayed. The front and rear surfaces are opposite to each other in the third direction DR3.

According to an embodiment, the directions indicated as the first to third directions DR1, DR2, and DR3 are relative and can be changed into different directions. Hereinafter, the first to third directions are the directions indicated by the first to third directions DR1, DR2, and DR3 and designated by the same reference numerals, respectively.

The electronic apparatus EA according to an embodiment of the inventive concept can sense an externally applied user's input TC. The user's input TC may come from various types of external inputs such as a portion of user's body, light, heat, or pressure, etc. In addition, the electronic apparatus EA can sense not only an input contacting the electronic apparatus EA but also an approaching or adjacent input.

In an embodiment, the user's input TC is illustrated as a user's hand applied to the front surface. However, this is merely an example, and embodiments are not limited thereto. For example, in other embodiments, as described above, the user's input TC may be provided in various types. The electronic apparatus EA can sense the user's input TC applied to a side surface or the rear surface of the electronic apparatus EA, based on a structure of the electronic apparatus EA, but is not limited to a specific embodiment.

According to an embodiment, the electronic apparatus EA includes a window 100, a display module 200, a circuit board 300, an electronic module 400, and an external ease 500. The window 100 and the external case 500 are coupled to each other and define an outer appearance of the electronic apparatus EA. The electronic apparatus EA according to an embodiment includes a cover pattern BL and an optical member POL.

According to an embodiment, window 100 includes a base window WBS and a bezel pattern BZL. The window 100 is disposed on the display module 200 and covers a front surface IS of the display module 200.

According to an embodiment, the base window WBS includes an optically transparent insulation material. For example, the base window WBS may include glass or plastic. The base window WBS may have a single layer or multilayered structure. For example, the base window WBS can have a laminated structure of a plurality of plastic films bonded to each other using an adhesive, or a laminated structure of a glass substrate and a plastic film that are bonded to each other using an adhesive. The transmission area TA, the active area AA, and the bezel area BZA are defined on the base window WBS.

According to an embodiment, the window 100 includes an externally exposed front surface FS. The front surface FS of the electronic apparatus EA corresponds to the front surface FS of the window.

In particular, according to an embodiment, each of the active area AA and the transmission area TA is an optically transparent area. A boundary of the active area AA has a shape that corresponds to that of the display area DA on the display module 200. For example, the active area AA overlaps an entire surface of or at least a portion of the display area DA. The image IM displayed on the display area DA of the display module 200 is visible through the active area AA.

According to an embodiment, the bezel pattern BZL is formed on the bezel area BZA. The bezel pattern BZL has a predetermined color. When the window 100 is a glass or plastic substrate, the bezel pattern BZL is a color layer that is printed or deposited on one surface of the glass or plastic substrate. Alternatively, the bezel pattern BZL can be formed by coloring a corresponding area of the glass or plastic substrate.

Thus, according to an embodiment, the bezel area BZA has a light transmittance that is relatively less than that of the active area AA. The bezel area BZA defines a shape of the active area AA. The bezel area BZA is formed adjacent to the active area AA and surrounds the active area AA.

According to an embodiment, the bezel area BZA covers a non-display area NDA of the display module 200 to prevent the non-display area NDA from being externally visible. However, this is merely an example, and embodiments are not limited thereto. For example, in other embodiments of the window 100, the bezel pattern BZL is omitted.

According to an embodiment, the display module 200 displays the image IM and senses an external input TC. The display module 200 includes the front surface IS that includes a display area DA and the non-display area NDA. The display area DA is activated according to an electrical signal.

According to an embodiment, the optical member POL is disposed between the window 100 and the display module 200. The optical member POL includes a polarizer and a phase retarder. The polarizer and the phase retarder may be stretched or coated. The optical member POL reduces reflectance of external light.

The optical member POL according to an embodiment includes a first opening GC. The first opening GC1 penetrates the optical member POL in the third direction DR3 and exposes an inner surface. The first opening GC overlaps the transmission area TA.

In an embodiment, the display area DA is an area on which the image IM is displayed, and in which the external input TC is sensed. The active area AA overlaps the display area DA of the window 100. For example, the active area AA overlaps an entire surface or at least a portion of the display area DA. Thus, the user can see the image IM or provide the external input TC through the active area AA. However, this is merely an example, and embodiments are not limited thereto. For example, in other embodiments, an area of the display area DA on which the image IM is displayed, and an area of the display area DA on which the external input TC is sensed, can be separated from each other, and the present disclosure is not limited to a specific embodiment.

According to an embodiment, the non-display area NDA is covered by the bezel area BZA of the window 100. The non-display area NDA is adjacent to the display area DA. The non-display area NDA surrounds the display area DA. A driving circuit or a driving line that drives the display area DA is disposed on the non-display area NDA.

According to an embodiment, various signal lines that provide electrical signals to the display area DA, pads PD, or electronic elements are disposed in the non-display area NDA. The non-display area NDA is covered by the bezel area BZA and is thus not visible from the outside.

In an embodiment, the display module 200 is assembled so that the display area DA and the non-display area NDA are flat and face the window 100. However, this is merely an example, and embodiments are not limited thereto. For example, in other embodiments, a portion of the non-display area NDA of the display module 200 is bent. Here, a portion of the non-display area NDA faces a rear surface of the electronic apparatus EA and reduces an area of the bezel BZA on the front surface of the electronic apparatus EA. Alternatively, in still other embodiments, the display module 200 is assembled so that a portion of the display area DA is bent. Alternatively, in the display module 200 according to an embodiment of the inventive concept, the non-display area NDA is omitted.

The display module 200 according to an embodiment includes a second opening GC2. The second opening GC2 passes through the display module 200 in the third direction DR3 to an inner surface. The second opening GC2 overlaps the transmission area TA. Thus, the second opening GC2 overlaps the first opening GC1. The inner surface of the second opening GC2 will be described below.

According to an embodiment, a predetermined hole line area HL is defined in the display module 200. In this embodiment, the hole line area HL is included in the display area DA. The hole line area HL according to an embodiment within the display area DA surrounds the second opening GC2.

According to an embodiment, lines that connect components that are disconnected or spaced apart from each other by the second opening GC2 are disposed in the hole area. Thus, the lines are disposed through the second opening GC2. A detailed description will be provided below.

According to an embodiment, the circuit board 300 is connected to the display module 200. The circuit board 300 includes a flexible board CF and a main board MB. The flexible board CF includes an insulation film and conductive lines mounted on the insulation film. The conductive lines are connected to the pads PD and electrically connect the circuit board 300 to the display module 200.

In an embodiment, the flexible board CF is assembled in a bent state. Thus, the main board MB is disposed on the rear surface of the display module 200 to be stably accommodated in a space provided by the external case 500. In other embodiments, the flexible board CF is omitted, in which case the main board MB is directly connected to the display module 200.

According to an embodiment, the main board MB includes signal lines and electronic elements. The electronic elements are connected to the signal lines and electrically connected to the display module 200. The electronic elements generate various electrical signals, such as signals that generate the image IM or signals that sense external inputs TC or process the sensed signals. A plurality of main boards MB are provided that correspond to electrical signals for generation and processing, but embodiments are not limited thereto.

Figure 3A:
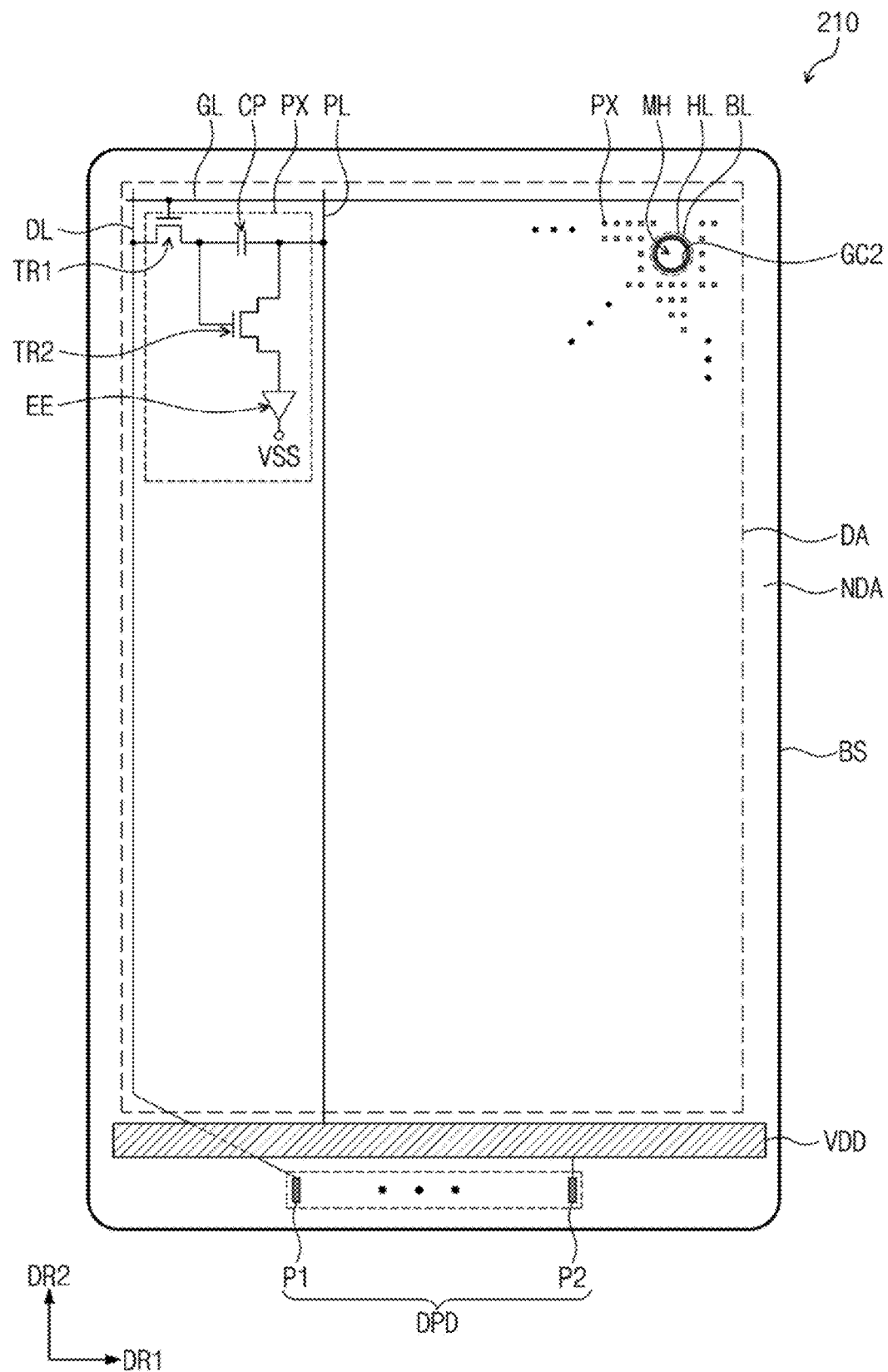
FIG. 3A is a plan view of a display panel according to an embodiment of the inventive concept.

In the electronic apparatus EA according to an embodiment of the inventive concept, a driving circuit that provides an electrical signal to the display area DA is directly mounted on the display module 200. Here, the driving circuit is mounted in the form of a chip or may be formed together with pixels PX, as shown in FIG. 3A, to be described below. Thus, an area of the circuit board 300 can be reduced or omitted.

According to an embodiment, electronic module 400 is disposed below display module 200. The display module 200 includes a module hole MH. The module hole MH is an opening that exposes the electronic module 400, among other constituents of the display module 200. For example, the module hole MH corresponds to the first opening GC1. The position of the transmission area TA varies depending on the position of the electronic module 400, i.e., the area in which the electronic module 400 is disposed.

According to an embodiment, the electronic module 400 transmits the external input through the module hole MH as an output.

According to an embodiment, at least one of a receiver that receives the external input and an output unit that transmits the output of the electronic module 400 overlaps the module hole MH. According to an embodiment of the inventive concept, the electronic module 400 overlaps the active area AA, thereby preventing an increase in the size of the bezel area BZA.

According to an embodiment, the cover pattern BL corresponds to the first opening GC1 of the optical member POL and the second opening GC2 of the display module 200. In more detail, the cover pattern BL is disposed on at least one of an inner surface of the first opening GC or an inner surface of the second opening GC2.

According to an embodiment, the cover pattern BL is formed spaced apart from the window 100. For example, the bezel pattern BZL is disposed below the base window WBS and overlaps the bezel area BZA of the window 100, and the cover pattern BL is disposed in the openings GC1 and GC2 respectively formed in each of the optical member POL and the display module 200. Thus, the cover pattern BL is spaced apart from the window 100.

In addition, according to an embodiment, the cover pattern BL is formed on each of the inner surfaces of the openings GC1 and GC2, i.e., to the cover pattern BL extends in the third direction DR3. Thus, when viewed from the front surface FS of the window 100, the cover pattern BL as appears not as a line shape but as a surface shape.

According to an embodiment, the cover pattern BL may be provided in a printed form on each of the inner surfaces of the openings GC1 and GC2, or may be provided as a separate member and thus disposed in the openings GC1 and GC2. Thus, the shape of the cover pattern BL corresponds to the shape of each of the inner surfaces of the openings GC1 and GC2. The cover pattern BL is not limited to a specific material as long as the material absorbs light and has a predetermined color. For example, in an embodiment, the cover pattern BL is black.

However, embodiments are not limited thereto. For example, in other embodiments, the cover pattern BL includes an optically transparent material. For example, the cover pattern BL includes a resin. In this case, the cover pattern BL blocks external moisture or oxygen introduced into the openings GC1 and GC2 and improves an impact resistance of each of the inner surfaces of the openings GC1 and GC2.

According to an embodiment of the inventive concept, since the cover pattern BL is disposed in any one of the openings GC and GC2 respectively formed in the optical member POL and the display module 200, but not on a bottom surface of the window 100, the cover pattern BL is not visible from the outside. Thus, the display apparatus EA has improved visibility.

Referring to FIG. 2, according to an embodiment, the display apparatus EA includes a display module 200, a power supply module PM, a first electronic module EM1, and a second electronic module EM2. The display module 200, the power supply module PM, the first electronic module EM1, and the second electronic module EM2 are electrically connected to each other. FIG. 2 illustrates a display panel 210 and a sensing sensor 220 of the constituents of the display module 200 as an example.

According to an embodiment, the first electronic module EM1 and the second electronic module EM2 include various functional modules that drive the electronic apparatus EA. The first electronic module EM1 may be directly mounted on a mother board electrically connected to the display module 200 or may be mounted on a separate board that is electrically connected to the mother board through a connector.

According to an embodiment, the first electronic module EM1 includes a control module CM, a wireless communication module TM, an image input module IIM, an audio input module AIM, a memory MM, and an external interface IF. Some of the modules are not mounted on the mother board but are electrically connected to the mother board through a flexible circuit board.

According to an embodiment, the control module CM controls the overall operation of the electronic apparatus EA. The control module CM may be a microprocessor. For example, the control module CM activates or inactivates the display module 200. The control module CM controls other modules such as the image input module IIM or the audio input module AIM based on a touch signal received from the display module 200.

According to an embodiment, the wireless communication module TM transmits/receives a wireless signal to/from another terminal using Bluetooth or Wi-Fi. The wireless communication module TM transmits/receives an audio signal using a general communication line. The wireless communication module TM includes a transmitter TM1 that modulates and transmits a signal and a receiver TM2 that receives and demodulates the received signal.

According to an embodiment, the image input module IM processes an image signal and converts the processed image signal into image data that can be displayed on the display module 200. The audio input module AIM receives external audio signals using a microphone in a recording mode or a voice recognition mode and converts the received audio signals into electrical sound data.

According to an embodiment, the external interface IF is an interface connected to, e.g., an external charger, a wired/wireless data port, or a card socket, such as a memory card or an SIM/UIM card.

According to an embodiment, the second electronic module EM2 includes an audio output module AOM, a light emitting module LM, a light receiving module LRM, and a camera module CMM. The above-described constituents may be directly mounted on the mother board, may be mounted on a separate board and electrically connected to the display module 200 through a connector, or may be electrically connected to the first electronic module EM.

According to an embodiment, the audio output module AOM converts audio data received from the wireless communication module TM or from audio data stored in the memory MM and outputs the converted audio data.

According to an embodiment, the light emitting module LM generates and outputs light. The light emitting module LM can output infrared light. For example, the light emitting module LM includes an LED element. For example, the light receiving module LRM senses infrared (IR) light. The light receiving module LRM is activated when infrared light having at least a predetermined intensity is sensed. The light receiving module LRM includes a CMOS sensor. Infrared light generated in the light emitting module LM is output and then reflected by an external object, such as a user's finger or face, and the reflected infrared light is incident into the light receiving module LRM. The camera module CMM photographs an external image.

The electronic module 400 according to an embodiment of the inventive concept includes at least one constituent of the first electronic module EM1 or the second electronic module EM2. For example, the electronic module 400 includes at least one of a camera, a speaker, an optical detection sensor, or a thermal (IR) detection sensor. The electronic module 400 senses an external object through the second opening GC2 or outputs a sound signal such as a voice through the second opening GC2. In addition, the electronic module 400 may include a plurality of other constituents, but is not limited to a specific embodiment.

According to an embodiment, the external case 500 is coupled to the window 100 and defines an outer appearance of the electronic apparatus EA. FIG. 1B illustrates an exemplary external case 500 provided as one member. However, embodiments are not limited thereto, and in other embodiments, the external case 500 includes two or more components assembled with each other.

Figure 3B:
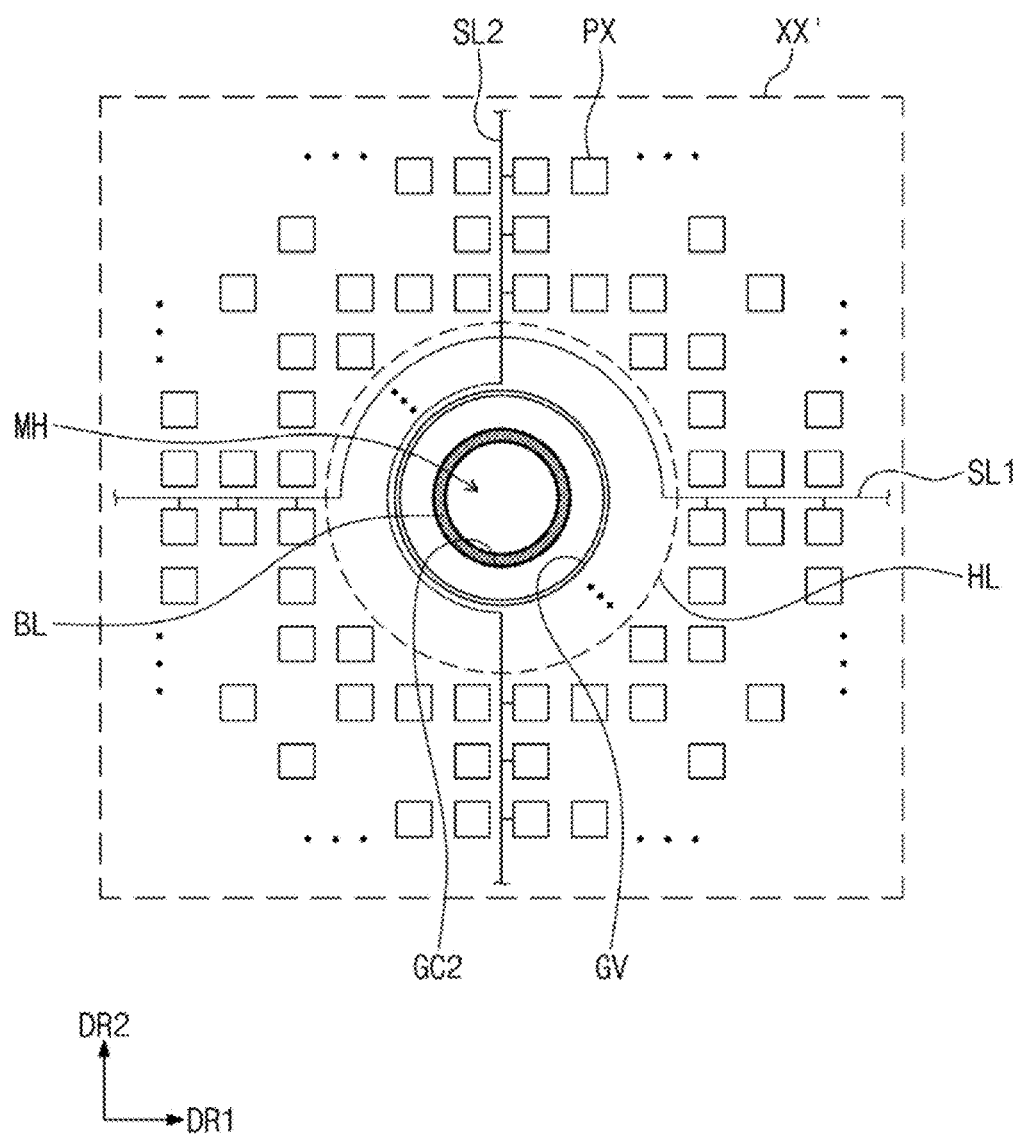
FIG. 3B is an enlarged view of an area XX' of FIG. 3A.
Figure 3C:
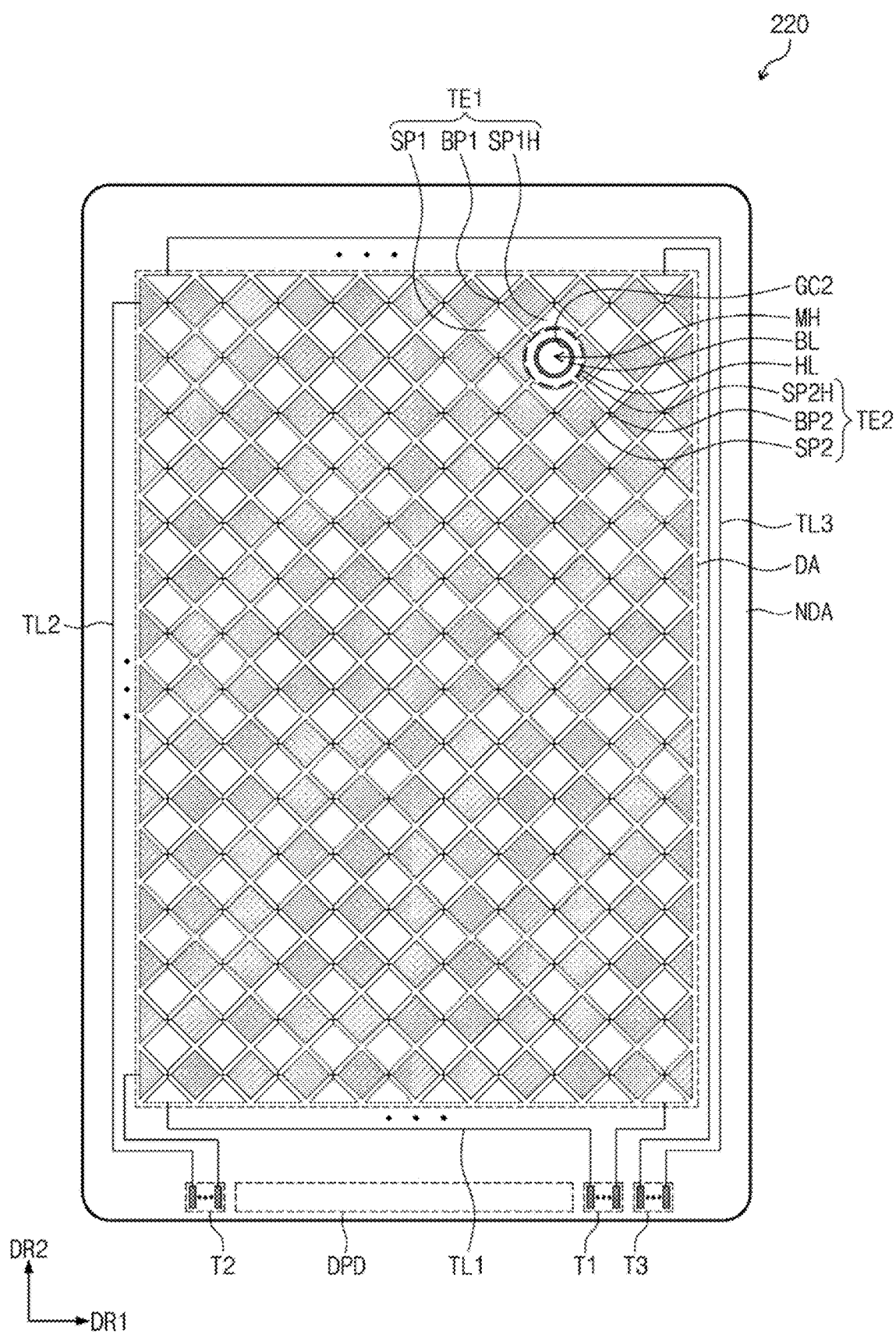
FIG. 3C is a plan view of a sensing sensor according to an embodiment of the inventive concept.
Figure 4:
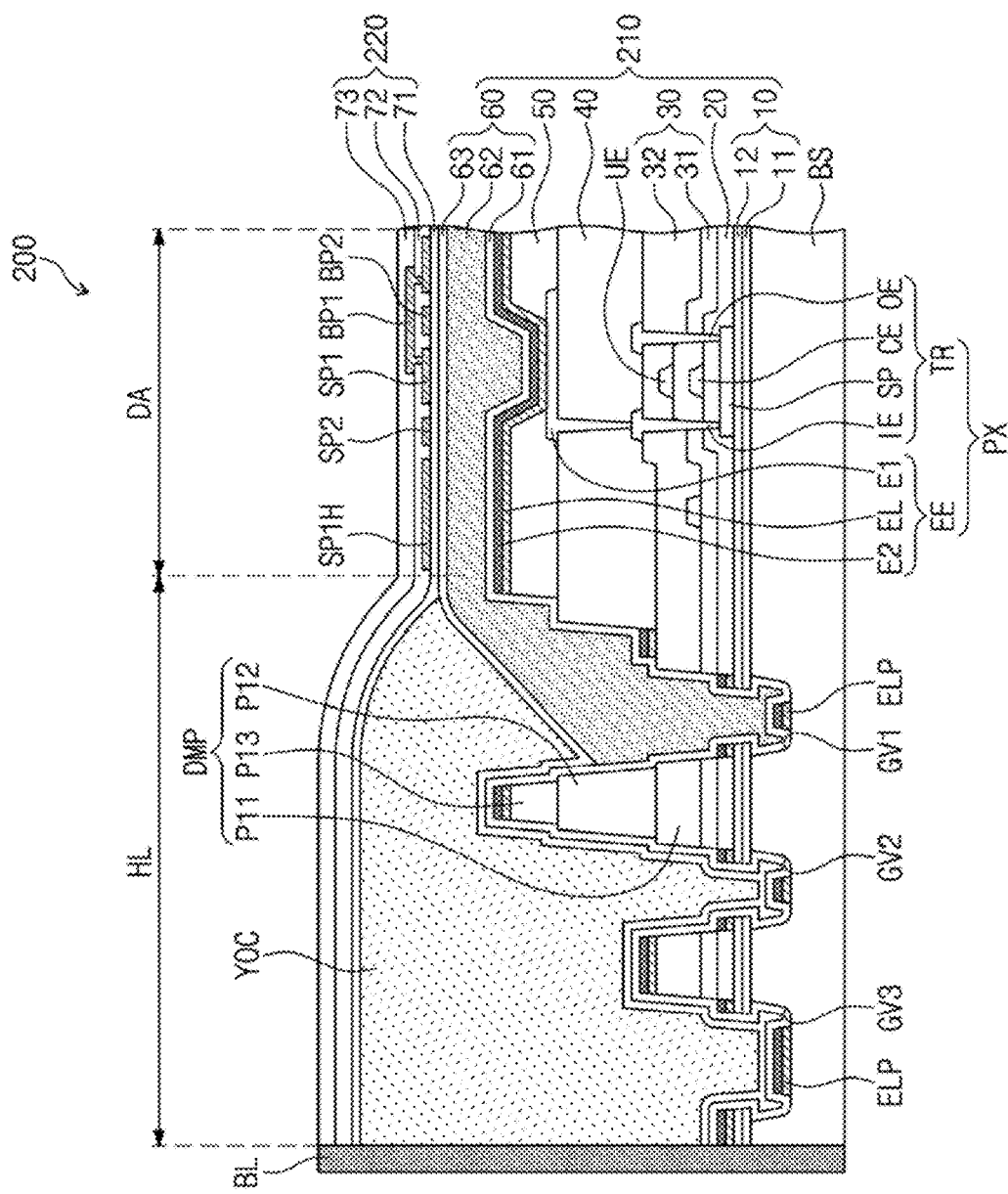
FIG. 4 is a cross-sectional view of a display panel according to an embodiment of the inventive concept.
Figure 4:
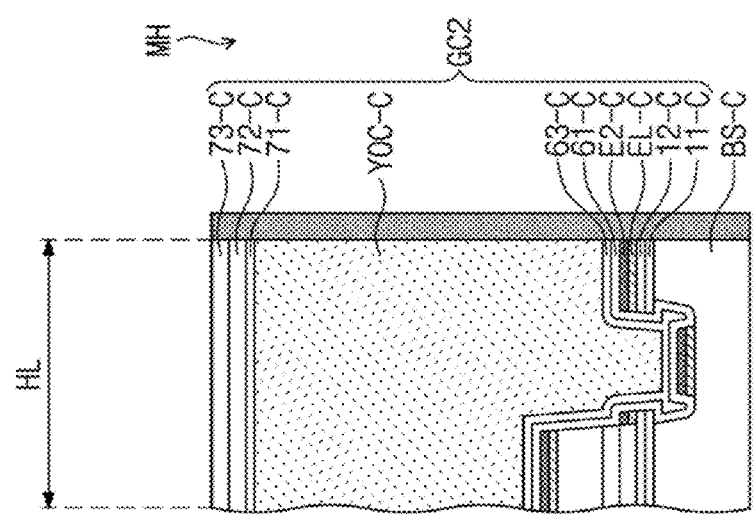

FIG. 3A is a plan view of a display panel according to an embodiment of the inventive concept. FIG. 3B is an enlarged view of an area XX' of FIG. 3A. FIG. 3C is a plan view of a sensing sensor according to an embodiment of the inventive concept. FIG. 4 is a cross-sectional view of a display panel according to an embodiment of the inventive concept.

FIG. 3A shows a schematic signal circuit diagram and an enlarged view of an area XX' of FIG. 1B. In FIGS. 3A to 3C, some components are omitted for convenience of description. Hereinafter, embodiments of the present disclosure will be described with reference to FIGS. 3A to 3C.

As illustrated in FIG. 3A, according to an embodiment, the display panel 210 includes a base substrate BS, a plurality of pixels PX, a plurality of signal lines GL, DL, and PL, and a plurality of display pads DPD. A display area DA and a peripheral area NDA are provided by the base substrate BS. The base substrate BS includes an insulation substrate. For example, the base substrate BS may be made of glass, plastic, or a combination thereof.

According to an embodiment, the signal lines GL, DL, and PL are connected to the pixels PX and transmit electrical signals to the pixels PX. A scan line GL, a data line DL, and a power line PL of the signal lines are illustrated as an example. However, the signal lines GL, DL, and PL further include at least one of an initialization voltage line and an emission control line, but embodiments are not limited thereto.

In an embodiment, a signal circuit diagram of one pixel PX of the plurality of pixels is illustrated as an example. The pixel PX includes a first thin film transistor TR1, a capacitor CP, a second thin film transistor TR2, and a light emitting element EE.

In an embodiment, the pixels PX may be disposed on the display area DA. However, this is merely an example, and embodiments are not limited thereto. For example, in other embodiments, in a portion of the pixels PX, a portion of the constituents, except for a light emitting element EE, can be disposed on the peripheral area NDA.

According to an embodiment, the first thin film transistor TR1 is a switching device that controls an on/off state of the pixel PX. The first thin film transistor TR transmits or blocks the data signal transmitted through the data line DL in response to the scan signal received through the scan line GL.

According to an embodiment, the capacitor CP is connected to the first thin film transistor TR1 and the power line PL. The capacitor CP charges an electrical charge by an amount that corresponds to a difference between the data signal received from the first thin film transistor TR1 and a first power signal received from the first power line PL.

According to an embodiment, the second thin film transistor TR2 is connected to the first thin film transistor TR1, the capacitor CP, and the light emitting element EE. The second thin film transistor TR2 controls a driving current that flows through the light emitting element EE to correspond to an amount of charge stored in the capacitor CP. A turn-on time of the second thin film transistor TR2 is determined by the amount of charge charged in the capacitor CP. The second thin film transistor TR2 provides the first power signal received through the power line PL to the light emitting element EE during the turn-on time.

According to an embodiment, the light emitting element EE generates light or controls an amount of light according to the electrical signal. The light emitting element EE may be one of an organic light emitting element, a quantum dot light emitting element, an electrophoretic element, or an electrowetting element.

According to an embodiment, the light emitting element EE is connected to a power source terminal VSS and receives a second power signal different from the first power signal received from the power line PL. A driving current that corresponds to a difference between the electrical signal received from the second thin film transistor TR2 and the second power signal flows through the light emitting element EE, and the light emitting element EE generates light corresponding to the driving current. However, this is merely an example, and embodiments are not limited thereto. For example, in other embodiments, the pixel PX can include electronic elements in various other configurations and arrangements.

According to an embodiment, the pixels PX are disposed around the hole line area HL and surround the hole line area HL on the plane. In FIG. 3B, for convenience of description, the hole line area HL is illustrated by a dotted line.

According to an embodiment, the area XX' of FIG. 3B includes an area in which a module hole MH is formed in the display panel 210. Hereinafter, the area of the display panel 210 adjacent to the module hole MH will be described with reference to FIG. 3B.

As described above, according to an embodiment, the second opening GC2 is formed in the display area DA. Thus, at least a portion of the pixels PX are disposed adjacent to the second opening GC2 and surround the second opening GC2.

As described above, according to an embodiment, the hole line area HL is an area on which are disposed lines that connect the constituents that are disconnected or spaced apart by the second opening GC2. Thus, lines are disposed through the second opening GC2.

According to an embodiment, a plurality of signal lines SL1 and SL2 connected to the pixels PX are disposed between the hole line area HL and the second opening GC2. The signal lines SL1 and SL2 are connected to the pixels PX via the second opening GC2. FIG. 3B illustrates for convenience of description an example in which a first signal line SL1 and a second signal line SL2 of the plurality of signal lines are connected to the pixels PX.

According to an embodiment, the first signal line SL1 extends in the first direction DR1. The first signal line SL1 is connected to the pixels PX in a same row that extends in the first direction DR1. A structure in which the first signal line SL1 corresponds to the scan line GL will be described as an example.

According to an embodiment, a portion of the pixels connected to the first signal line SL1 are disposed at a left side with respect to the second opening GC2, and others are disposed at a right side with respect to the second opening GC2. Thus, pixels in the same row connected to the first signal line SL1 can be turned on/off by substantially the same gate signal even though a portion of the pixels that would correspond to the second opening GC2 are omitted.

According to an embodiment, the second signal line SL2 extends in the second direction DR2. The second signal line SL2 is connected to pixels PX in a same column that extends in the second direction DR2. A structure in which the second signal line SL2 corresponds to the data line DL will be described as an example.

According to an embodiment, a portion of the pixels connected to the second signal line SL2 are disposed at an upper side with respect to the second opening GC2, and others are disposed at a lower side with respect to the second opening GC2. Thus, the pixels in the same column connected to the second signal line SL2 can receive a data signal through the same line even though a portion of the pixels that would correspond to the second opening GC2 are omitted.

The display module 200 according to an embodiment of the inventive concept further includes a connection pattern disposed in the hole line area HL. Here, the first signal line SL1 is disconnected in an area that overlaps the second opening GC2. The connected portion of the first signal line SL is connected through the connection pattern. Similarly, the second signal line SL2 is disconnected in the area that overlaps the second opening GC2, and a connection pattern is provided that connects the disconnected portions of the second signal line to each other.

Referring again to FIG. 3A, according to an embodiment, a power source pattern VDD is disposed on the peripheral area NDA. In this embodiment, the power source pattern VDD is connected to the plurality of power lines PL. Thus, the display panel 210 includes the power source pattern VDD to provide the same first power signal to the plurality of pixels.

According to an embodiment, the display pads DPD include a first pad P1 and a second pad P2. A plurality of first pads P1 are provided, and the plurality of first pads P1 are connected to the data lines DL, respectively. The second pad P2 is connected to the power source pattern VDD and electrically connected to the power line PL. The display panel 210 provides externally received electrical signals to the pixels PX through the display pads DPD. The display pads DPD further include pads that receive other electrical signals in addition to the first pad P1 and the second pad P2, embodiments are not limited thereto.

According to an embodiment, a predetermined recessed pattern GV is formed in the hole line area HL. The recessed pattern GV is formed on the plane along an edge of the second opening GC2. In an embodiment, the recessed pattern GV is illustrated as having a circular ring shape that surrounds the second opening GC2. However, this is merely an example, and embodiments are not limited thereto. For example, in other embodiments, the recessed pattern GV has a shape that differs from that of the hole MH, such as a polygonal shape, an oval shape, or at least partial circular shape, or may be one of a plurality of partially cut patterns.

Referring to FIG. 3C, according to an embodiment, the sensing sensor 220 is disposed on the display panel 210. The sensing sensor 220 senses the external input TC to obtain position or intensity information of the external input TC. The sensing sensor 220 includes a plurality of first sensing electrodes TE1, a plurality of second sensing electrodes TE2, a plurality of sensing lines TL1, TL2, and TL3, and a plurality of sensing pads T1, T2, and T3.

According to an embodiment, the sensing sensor 220 obtains information on the external input TC through a change in capacitance between the first sensing electrodes TE1 and the second sensing electrodes TE2.

According to an embodiment, the first sensing electrodes TE1 are arranged in the first direction DR1 and extend in the second direction DR2. Each of the first sensing electrodes TE1 includes a first sensing pattern SP1 and a first connection pattern BP1.

According to an embodiment, the first sensing pattern SP1 is disposed on the display area DA. The first sensing pattern SP1 is spaced apart from the second opening GC2. The first sensing pattern SP1 has a predetermined shape and has a first surface area. In an embodiment, the first sensing pattern SP1 has a diamond shape. However, this is merely an example, and embodiments are not limited thereto. For example, in other embodiments, the first sensing pattern SP1 has various other shapes.

According to an embodiment, the first connection pattern BP1 is disposed on the display area DA. The first connection pattern BP1 extends in the second direction DR2. The first connection pattern BP1 is connected to the first sensing pattern SP1. The first connection pattern BP1 is disposed between two first sensing patterns SP1 adjacent to each other in the second direction DR2 and connects the two adjacent first sensing patterns SP1 to each other.

According to an embodiment, the second sensing electrodes TE2 are arranged in the second direction DR2 and extend in the first direction DR1. Each of the second sensing electrodes TE2 includes a second sensing pattern SP2 and a second connection pattern BP2. The second connection pattern BP2 extends in the first direction DR1 and is disposed between two second sensing patterns SP2 adjacent to each other in the first direction DR1 and connects the two adjacent second sensing patterns SP2 to each other.

According to an embodiment, the second sensing pattern SP2 is spaced apart from the second opening GC2. The second sensing pattern SP2 is spaced apart from the first sensing pattern SP1. In an embodiment, the separation between the first sensing pattern SP1 and the second sensing pattern SP2 is a separation in a cross-section. The first sensing pattern SP1 and the second sensing pattern SP2 do not contact each other to transmit or receive independent electrical signals.

In an embodiment, the second sensing pattern SP2 has the same shape as the first sensing pattern SP1. For example, the second sensing pattern SP2 has a diamond shape. However, this is merely an example, and embodiments are not limited thereto. For example, in other embodiments, the second sensing pattern SP2 can have various other shapes.

According to an embodiment, patterns of the first sensing pattern SP1 and the second sensing pattern SP2 that are adjacent to the second opening GC2 have a shape that differs from patterns that are away from the second opening GC2. In an embodiment, a first sub sensing pattern SP1H and a second sub sensing pattern SP2H adjacent to the second opening GC2 are illustrated as an example.

According to an embodiment, the first sub sensing pattern SP1H is connected to an adjacent first sub sensing pattern SP1H through sensing lines disposed in the hole line area HL. The first sub sensing pattern SP1H is connected to an adjacent first sensing pattern SP1 in the second direction DR2 through the first connection pattern BP1. According to an embodiment, a surface area of the first sub sensing pattern SP1H is less than a first surface area of the first sensing pattern SP1.

According to an embodiment, the second sub sensing pattern SP2H is connected to the adjacent second sub sensing pattern SP2H through sensing lines disposed on the hole line area HL. The second sub sensing pattern SP2H is connected to the adjacent second sensing pattern SP2 in the first direction DR1 through the second connection pattern BP2. According to an embodiment, a surface area of the second sub sensing pattern SP2H is less than a second surface area of the second sensing pattern SP2.

According to an embodiment, the sensing lines TL1, TL2, and TL3 are disposed in the peripheral area NDA. The sensing lines TL1, TL2, and TL3 include first sensing lines TL1, second sensing lines TL2, and third sensing line TL3.

According to an embodiment, the first sensing lines TL1 are connected to the first sensing electrodes TE1, respectively. In an embodiment, the first sensing lines TL1 are connected to first ends of the first sensing electrodes TE1 closest to the plurality of sensing pads T1, T2, and T3, respectively.

According to an embodiment, each of the second sensing lines TL2 is connected to one end of each of the second sensing electrodes TE2. In this embodiment, the second sensing lines TL2 are connected to left ends of the second sensing electrodes TE2, respectively.

According to an embodiment, the third sensing lines TL3 are connected to second ends of the first sensing electrodes TE1 farthest from the plurality of sensing pads T1, T2, and T3, respectively. According to an embodiment of the inventive concept, the first sensing electrodes SE) are respectively connected to the first sensing lines TL1 and the third sensing lines TL3. Thus, the sensitivity of an area with respect to the first sensing electrodes TE1, each of which is longer than each of the second sensing electrodes TE2, can be uniformly maintained. However, this is merely an example, and embodiments are not limited thereto. In a sensing sensor 220 according to other embodiments of the inventive concept, the third sensing lines TL3 are omitted.

According to an embodiment, the sensing pads T1, T2, and T3 are disposed on the peripheral area NDA. The sensing pads T1, T2, and T3 include first sensing pads T, second sensing pads T2, and third sensing pads T3. The first sensing pads T1 are respectively connected to first ends of the first sensing lines TL1 and provide external signals to the first sensing electrodes TE1. The second sensing pads T2 are respectively connected to the second sensing lines TL2 and are electrically connected to the second sensing electrodes TE2, and the third sensing pads T3 are respectively connected to the third sensing lines TL3 to be electrically connected to second ends of the first sensing electrodes TE1.

As illustrated in FIG. 4, according to an embodiment, the display panel 210 and the sensing sensor 220 in the display module 200 are laminated in the third direction DR3. The display panel 210 includes a base substrate BS, a pixel PX, a plurality of insulation layers 10, 20, 30, 40, and 50, and an encapsulation layer 60.

As described above, according to an embodiment, the base substrate BS is an insulating substrate. For example, the base substrate BS may be a plastic substrate or a glass substrate.

In an embodiment, FIG. 4 illustrates a thin film transistor TR that corresponds to the second thin film transistor TR2 and a light emitting element EE of the constituents of the equivalent circuit diagram of the pixel PX of FIG. 3A. The insulation layers 10, 20, 30, 40, and 50 include first to fifth insulation layers 10, 20, 30, 40, and 50 that are sequentially laminated. Each of the first to fifth insulation layers 10, 20, 30, 40, and 50 may include an organic material or an inorganic material and has a single layer or multilayered structure.

According to an embodiment of the inventive concept, a layer that includes insulation layers 10, 20, and 30 and the thin film transistor TR is a circuit element layer, and a layer including the remaining insulation layers 40 and 50 and the light emitting element EE is a display element layer.

Thus, according to an embodiment, a circuit element layer that includes the thin film transistor is disposed on the base substrate BS, and a display element layer that includes the light emitting element EE connected to the thin film transistor TR is disposed on the circuit element layer. The encapsulation layer 60 that covers the light emitting element EE is disposed on the circuit element layer, and the sensing sensor 220 is directly disposed on the encapsulation layer 60.

According to an embodiment, the first insulation layer 10 is disposed on the base substrate BS and covers the entire surface of the base substrate BS. The first insulation layer 10 includes one or more of a barrier layer 11 or a buffer layer 12. Thus, the first insulation layer 10 prevents oxygen or moisture introduced through the base substrate BS from permeating into the pixel or reduces surface energy of the base substrate BS to stably form a pixel on the base substrate BS. The third insulation layer 30 includes a lower third insulation layer 31 disposed on the second insulation layer 20, and an upper third insulation layer 32 disposed on the lower third insulation layer 31.

However, this is merely an example, and embodiments are not limited thereto. For example, in other embodiments, in the display module 200 according to an embodiment of the inventive concept, at least one of the barrier layer 11 and the buffer layer 12 may be omitted, and a plurality of layers may be laminated. Similarly, at least one of the lower third insulation layer 31 and the upper third insulation layer 32 may be omitted.

According to an embodiment, the thin film transistor TR is disposed on the first insulation layer 10. The thin film transistor TR includes a semiconductor pattern SP, a control electrode CE, an input electrode IE, and an output electrode OE. The semiconductor pattern SP is disposed on the first insulation layer 10. The semiconductor pattern SP includes a semiconductor material. The control electrode CE is spaced apart from the semiconductor pattern SP with the second insulation layer 20 therebetween. The control electrode CE is connected to one electrode of the first thin film transistor TR1 of FIG. 3A and the capacitor CP of FIG. 3A.

According to an embodiment, the input electrode IE and the output electrode OE are disposed on the third insulation layer 30 and spaced apart from each other on a plane. The input electrode IE and the output electrode OE are respectively connected to one side and the other side of the semiconductor pattern SP through the second insulation layer 20, and the lower third insulation layer 31 and the upper third insulation layer 32.

The display panel 210 according to an embodiment of the inventive concept further includes an upper electrode UE. The upper electrode UE is disposed between the lower third insulation layer 31 and the upper third insulation layer 32. The upper electrode UE overlaps the control electrode CE. In an embodiment, the upper electrode UE may receive the same electrical signal as the control electrode CE or may receive a different electrical signal from the control electrode CE to function as one electrode of a capacitor. However, this is merely an example, and embodiments are not limited thereto. In the display module 200 according to other embodiments of the inventive concept, the upper electrode UE is omitted.

According to an embodiment, the fourth insulation layer 40 is disposed on the third insulation layer 30 and covers the input electrode IE and the output electrode OE. In the thin film transistor TR, the semiconductor pattern SP is disposed under the control electrode CE. However, in another embodiment, the semiconductor pattern SP is disposed on the input electrode IE and the output electrode OE. Alternatively, in other embodiments, the input electrode IE and the output electrode OE are disposed on the same layer as the semiconductor pattern SP and are directly connected to the semiconductor pattern SP. The thin film transistor TR according to an embodiment of the inventive concept may have various structures and is not limited to a specific embodiment.

According to an embodiment, the light emitting element EE is disposed on the fourth insulation layer 40. The light emitting element EE includes a first electrode E1, an organic layer EL, and a second electrode E2.

According to an embodiment, the first electrode E1 penetrates the fourth insulation layer 40 and is connected to the thin film transistor TR. In addition, the display module 200 further includes a separate connection electrode disposed between the first electrode E1 and the thin film transistor TR. Here, the first electrode E1 is electrically connected to the thin film transistor TR through the connection electrode.

According to an embodiment, the fifth insulation layer 50 is disposed on the fourth insulation layer 40. The fifth insulation layer 50 includes one or more of an organic material or an inorganic material and may have a single layer or multilayered structure. An opening is formed in the fifth insulation layer 50. The opening exposes at least a portion of the first electrode E1. The fifth insulation layer 50 is a pixel defining layer.

According to an embodiment, the organic layer EL is disposed between the first electrode E1 and the second electrode E2. The organic layer EL includes at least one light emitting layer. For example, the organic layer EL may include at least one of a material that emits red, green or blue light and include a fluorescent material or a phosphorescent material. The organic layer EL may include an organic light emitting material or an inorganic light emitting material. The organic layer EL emits light in response to a difference in potential between the first electrode E1 and the second electrode E2.

In an embodiment, the organic layer EL is illustrated as a layer that has an integrated shape that overlaps the plurality of openings. However, this is merely an example, and embodiments are not limited thereto. For example, in other embodiments, the organic layer EL includes a plurality of patterns that respectively correspond to each opening.

According to an embodiment, the organic layer EL further includes a charge control layer in addition to the light emitting layer. The charge control layer controls movement of the charges to improve luminous efficiency and lifespan of the light emitting element. According to an embodiment, the organic layer EL includes at least one of hole transport material, a hole injection material, an electron transport material, and an electron injection material.

According to an embodiment, the second electrode E2 is disposed on the organic layer EL. The second electrode E2 faces the first electrode E1. The second electrode E2 has an integrated shape that extends from the display area DA to the peripheral area NDA. The second electrode E2 is commonly provided to the plurality of pixels. The light emitting element EE disposed on each of the pixels receives a common power voltage, hereinafter referred to as a second power voltage, through the second electrode E2.

According to an embodiment, the second electrode E2 may include a transmissive conductive material or a transflective conductive material. Thus, light generated in the light emitting element EE is easily emitted in the third direction DR3 through the second electrode E2. However, this is merely an example, and embodiments are not limited thereto. For example, in other embodiments, the light emitting element EE is driven as a bottom emission type that includes a transmissive or semi-transmissive material or is driven as a double-side emission type in which light is emitted from both of the front and rear surfaces.

According to an embodiment, the encapsulation layer 60 is disposed on the light emitting element EE and encapsulates the light emitting element EE. The encapsulation layer 60 is a thin film encapsulation layer that is directly deposited on the light emitting element EE.

In addition, according to an embodiment, a capping layer that covers the second electrode E2 is further disposed between the second electrode E2 and the encapsulation layer 60.

According to an embodiment, the encapsulation layer 60 includes a first inorganic layer 61, an organic layer 62, and a second inorganic layer 63, which are sequentially laminated in the third direction DR3. However, this is merely an example, and embodiments of the inventive concept are not limited thereto. For example, in other embodiments, the encapsulation layer 60 further includes a plurality of inorganic layers and organic layers.

According to an embodiment, the first inorganic layer 61 covers the second electrode E2. The first inorganic layer 61 prevents external moisture or oxygen from permeating into the light emitting element EE. For example, the first inorganic layer 61 includes one of silicon nitride or silicon oxide, or a combination thereof. The first inorganic layer 61 is formed through a chemical vapor deposition process.

According to an embodiment, the organic layer 62 is disposed on the first inorganic layer 61 and contacts the first inorganic layer 61. The organic layer 62 provides a flat surface on the first inorganic layer 61. Curves formed on a top surface of the first inorganic layer 61 or particles present on the first inorganic layer 61 are covered by the organic layer 62 to prevent the top surface of the first inorganic layer 61 from having an influence on the constituents disposed on the organic layer 62. In addition, the organic layer 62 reduces stress between the layers that contact each other. The organic layer 62 includes an organic material and is formed through a solution process such as spin coating, slit coating, or an inkjet process, etc.

According to an embodiment, the second inorganic layer 63 is disposed on the organic layer 62 and covers the organic layer 62. The second inorganic layer 63 can be relatively stably formed on the flat surface of the organic layer 62 as compared to forming the second inorganic layer 63 on the first inorganic layer 61. The second inorganic layer 63 encapsulates moisture discharged from the organic layer 62 to prevent the moisture from being introduced into the sensing sensor 220. The second inorganic layer 63 includes one of silicon nitride or silicon oxide, or a combination thereof. The second inorganic layer 63 is formed through a chemical vapor deposition process.

According to an embodiment, recessed patterns GV1, GV2, and GV3, the dam part DMP, and the signal lines SL1 and SL2 of the display panel 210 are disposed in the hole line area HL.

According to an embodiment, the recessed patterns GV, GV2, and GV3 are spaced apart from each other. The recessed patterns GV1, GV2, and GV3 include first, second and third recessed patterns GV1, GV2, and GV3, which are spaced apart from the display area DA and are sequentially disposed in a direction that approaches the second opening GC2. Each of the first to third recessed patterns GV1, GV2, and GV3 may have a closed line shape that surrounds the second opening GC2 or an intermittent line shape that surrounds at least a portion of an edge of the second opening GC2, but is not limited to a specific embodiment.

According to an embodiment, each of the recessed patterns GV1, GV2, and GV3 is recessed from the top surface of the base substrate BS. Each of the recessed patterns GV1, GV2, and GV3 may be provided by removing at least a portion of the base substrate BS. A deposition pattern ELP is disposed in each of the recessed patterns GV1, GV2, and GV3 and is covered by at least one of the first inorganic layer 61 or the second inorganic layer 63.

Since the display module 200 according to an embodiment of the inventive concept further includes the recessed patterns GV1, GV2, and GV3, continuity between the deposition pattern ELP and the light emitting element EE can be prevented. Thus, permeation of external moisture or oxygen can be blocked to prevent damage to the elements disposed on the active area AA.

In addition, according to an embodiment, the deposition pattern ELP disposed on each of the recessed patterns GV1, GV2, and GV3 is covered by the first inorganic layer 61 to prevent the deposition pattern ELP from influencing other elements when the display module 200 is manufactured. Thus, process reliability of the display module 200 is improved. However, this is merely an example, and embodiments are not limited thereto. For example, in other embodiments, one or more of the recessed patterns GV1, GV2, and GV3 can be omitted.

According to an embodiment, the dam part DMP is disposed on the hole line area HL and partitions the formation area of the organic layer 62 into a predetermined area and prevents further expansion. A plurality of dam parts DMP are provided and disposed between the recessed patterns GV1, GV2, and GV3. FIG. 4 illustrates the dam part DMP as a laminated structure that includes first to third layers P11, P12, and P13. However, this is merely an example, and embodiments are not limited thereto. For example, in other embodiments, the dam part DMP has a single layer structure.

According to an embodiment, the display module 200 further includes a planarization layer YOC. The planarization layer YOC includes an organic material. The planarization layer YOC overlaps the hole line area HL. The planarization layer YOC covers a non-planar surface formed in the hole line area HL by the dam part DMP or the recessed patterns GV1, GV2, and GV3 and provides a flat top surface thereof.

Thus, according to an embodiment, the flat surface is stably provided in the hole line area HL even on an area on which the organic layer 62 is not disposed. However, this is merely an example, and embodiments are not limited thereto. For example, in other embodiments, the planarization layer YOC can be omitted.

According to an embodiment, the sensing sensor 220 includes a plurality of conductive patterns and a plurality of sensing insulation layers 71, 72, and 73. The sensing insulation layers 71, 72 and 73 include first to third sensing insulation layers 71, 72 and 73 sequentially laminated in the third direction DR3.

According to an embodiment, the first sensing insulation layer 71 covers the planarization layer YOC. The first sensing insulation layer 71 covers a top surface of the planarization layer YOC within the hole line area HL and a top surface of the second inorganic layer 63 within the display area DA. The conductive patterns SP1, SP1H, SP2, and BP2 are disposed on the first sensing insulation layer 71.

According to an embodiment, the second sensing insulation layer 72 and the third sensing insulation layer 73 have an integrated shape that overlaps the hole line area HL and the display area DA. A portion BP1 of the conductive patterns are disposed on the second sensing insulation layer 72 and covered by the third sensing insulation layer 73.

According to an embodiment, each of the first to third sensing insulation layers 71, 72, and 73 includes one or more of an inorganic layer or an organic layer. In an embodiment, each of the first to third sensing insulation layers 71, 72, and 73 is illustrated as a single layer, but embodiments are not limited thereto, and in other embodiments have a laminated structure that includes a plurality of layers that contact each other.

In an embodiment, most of the first sensing electrodes TE1 of FIG. 3C and the second sensing electrodes TE2 of FIG. 3C are disposed between the second sensing insulation layer 72 and the third sensing insulation layer 73, and one of the first connection pattern BP1 and the second connection pattern BP2 is disposed on a different layer to connect adjacent sensing patterns to each other. However, this is merely an example, and embodiments are not limited thereto. For example, in other embodiments, the first sensing electrode TE1 and the second sensing electrode TE2 are disposed on different layers.

According to an embodiment, FIG. 4 illustrates a structure in which a portion of the cover pattern BL is disposed in the second opening GC2 formed in the display module 200. The second opening GC2 that exposes constituents of the display module 200 is surrounded by inner surfaces that pass through the display module 200.

For example, according to an embodiment, the second opening GC2 is formed by aligning an inner surface BS-C of the base substrate BS-C, the inner surfaces 11-C and 12-C of the first insulation layer, the inner surface EL-C of the organic layer, the inner surface E2-C of the second electrode, the inner surfaces 61-C and 62-C of the inorganic layers, the inner surface YOC-C of the planarization layer, and the inner surfaces 71-C, 72-C, and 73-C of the sensing insulation layers.

According to an embodiment, the cover pattern BL corresponds to the inner surfaces of the second opening GC2.

According to an embodiment of the inventive concept, since the cover pattern BL is disposed on the inner surfaces of the openings GC and GC2, the cover pattern BL is disposed is a relatively narrow area as compared to a structure in which the cover pattern BL is directly disposed on the rear surface of the window 100. Accordingly, the electronic apparatus EA has improved reliability.

Figure 5:
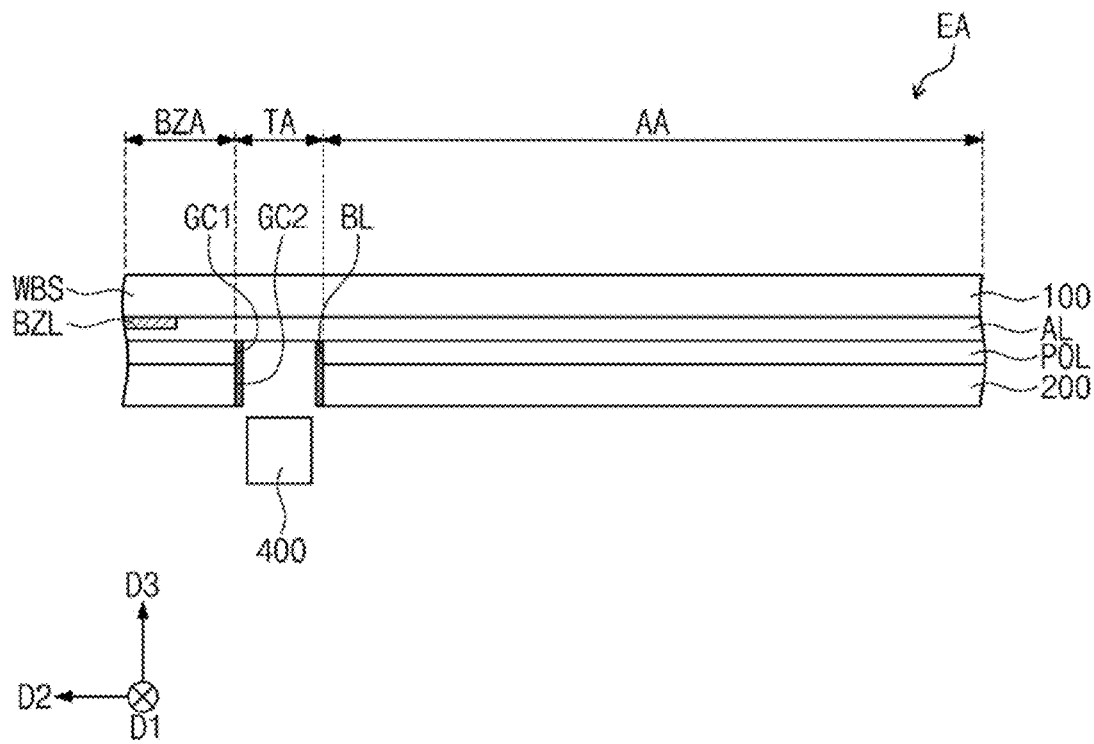
FIG. 5 is a cross-sectional view of one constituent of an electronic apparatus according to an embodiment of the inventive concept.
Figure 6:
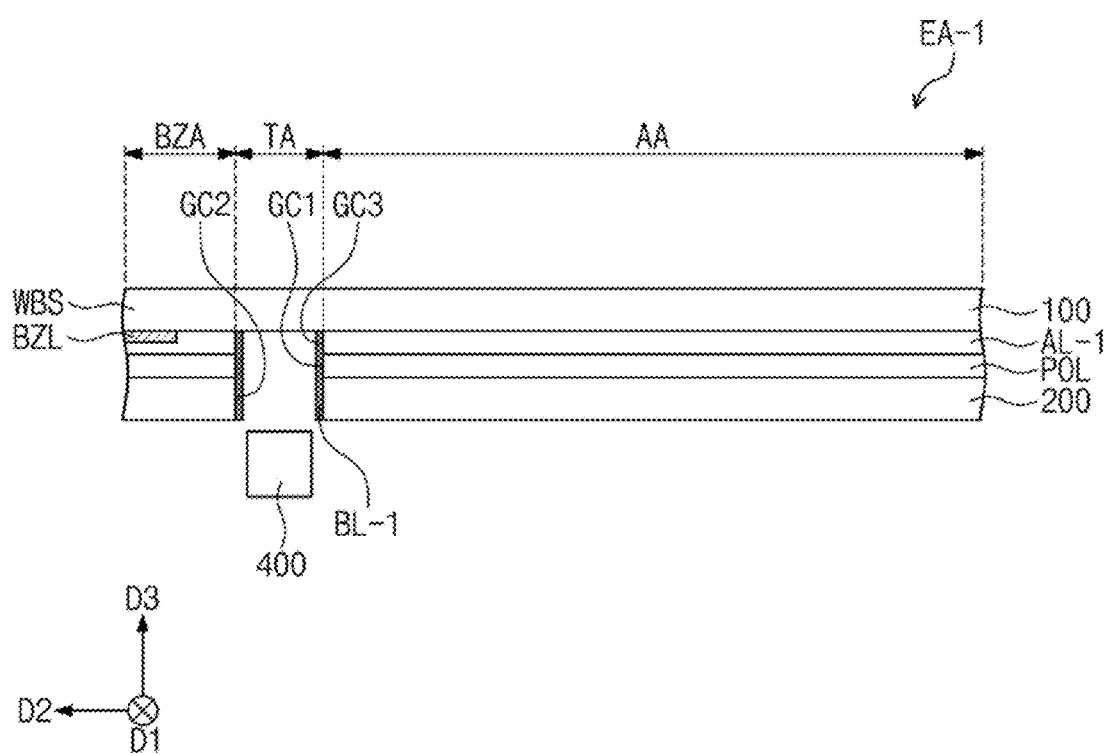
FIG. 6 is a cross-sectional view of one constituent of an electronic apparatus according to an embodiment of the inventive concept.
Figure 7:
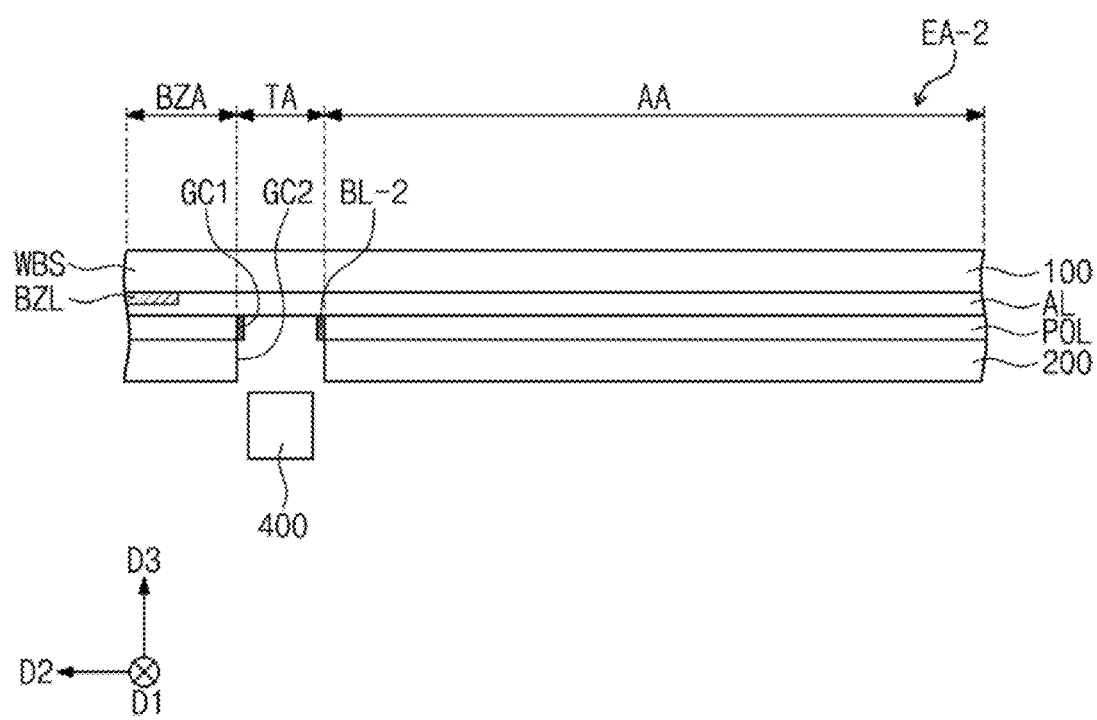
FIG. 7 is a cross-sectional view of one constituent of an electronic apparatus according to an embodiment of the inventive concept.

FIG. 5 is a cross-sectional view of one constituent of an electronic apparatus according to an embodiment of the inventive concept. FIG. 6 is a cross-sectional view of one constituent of an electronic apparatus according to an embodiment of the inventive concept. FIG. 7 is a cross-sectional view of one constituent of an electronic apparatus according to an embodiment of the inventive concept. The same/similar reference numerals are used for the components as those of FIGS. 1A to 3C, and thus, their duplicated descriptions will be omitted.

Referring to FIG. 5, according to an embodiment, the electronic apparatus EA further includes an adhesion layer AL disposed between the window 100 and the optical member POL.

According to an embodiment, the adhesion layer AL bonds the window 100 to the optical member POL. The adhesion layer AL includes at least one of an optical clear resin OCR, an optical clear adhesive OCA, or a pressure sensitive adhesive PSA. In addition, the adhesion layer AL is provided as a double-sided tape, but embodiments are not limited thereto.

According to an embodiment, the adhesion layer AL contacts a partial area of the window 100 and not a remaining area of the window 100. For example, the adhesion layer AL contacts the window 100 in the transmission area TA and the active area AA of the window 100, but not in the bezel area BZA. In the bezel region BZA, the adhesion layer AL contacts the bezel pattern BZL.

According to an embodiment of the inventive concept, the bezel pattern BZL disposed on the window 100 and the cover pattern BL disposed on the transmission area TA do not overlap each other.

In an embodiment, the cover pattern BL extends from the first opening GC1 formed in the optical member POL to the second opening GC2 formed in the display module 200.

Referring to FIG. 6, an electronic apparatus EA-1 according to an embodiment further includes an adhesion layer AL-1. The adhesion layer AL-1 has a third opening GC3 that passes through the adhesion layer AL-1. The third opening GC3 is aligned with the second opening GC2 and the first opening GC1 and overlaps an electronic module 400.

In an embodiment, a cover pattern BL-1 extends from an inner side surface of the third opening portion GC3 to an inner side surface of a first opening portion GC1.

Referring to FIG. 7, a cover pattern BL-2 of an electronic apparatus EA-2 according to an embodiment is not disposed on an inner side surface of a second opening GC2. The second opening GC2 is externally exposed.

However, this is merely an example, and embodiments are limited thereto. For example, in other embodiments, the cover pattern is disposed only in an opening in an adhesion layer AL or only in an opening in a display module 200.

Figure 8A:
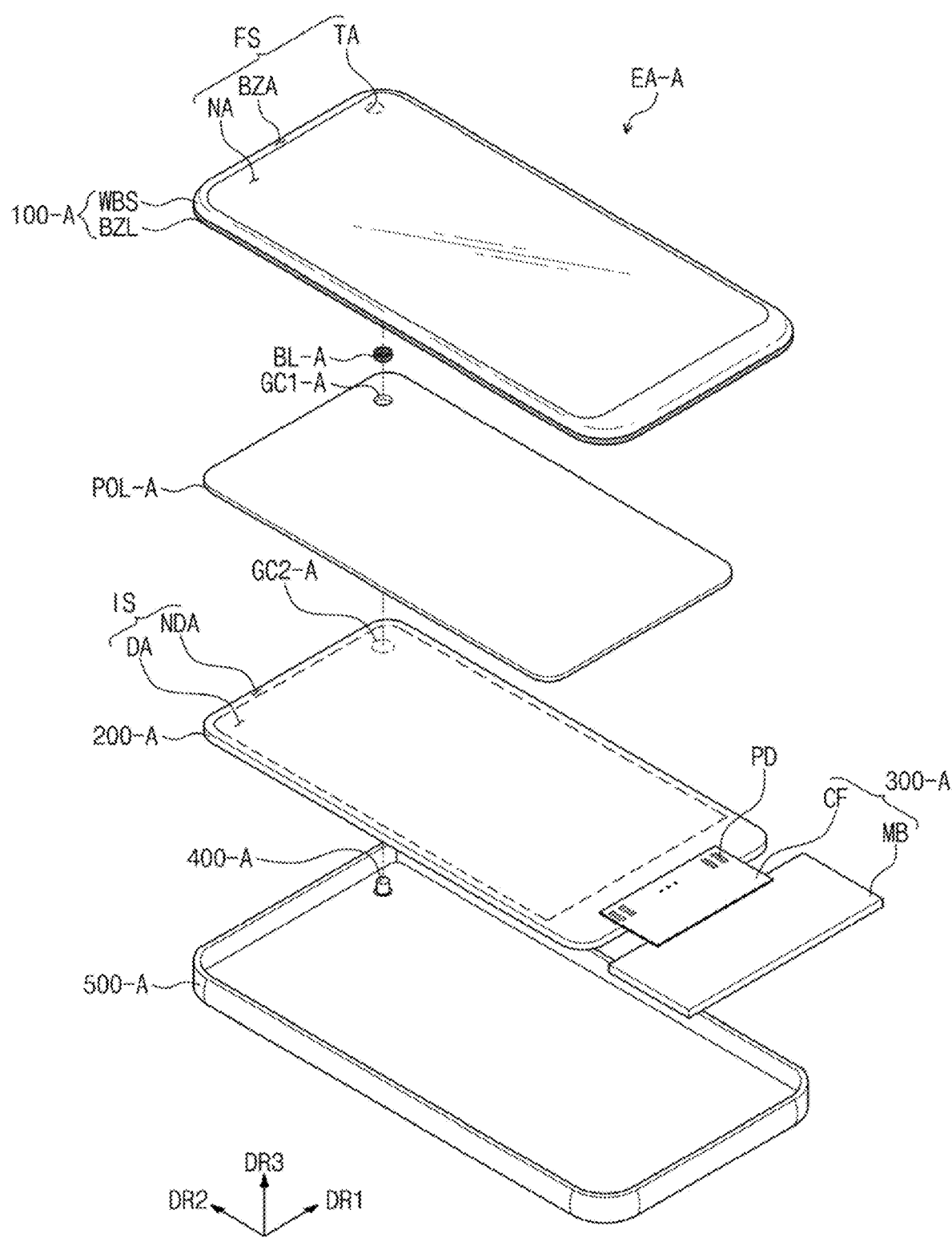
FIG. 8A is an exploded perspective view of an electronic apparatus of FIG. 1A according to an embodiment of the inventive concept.
Figure 8B:
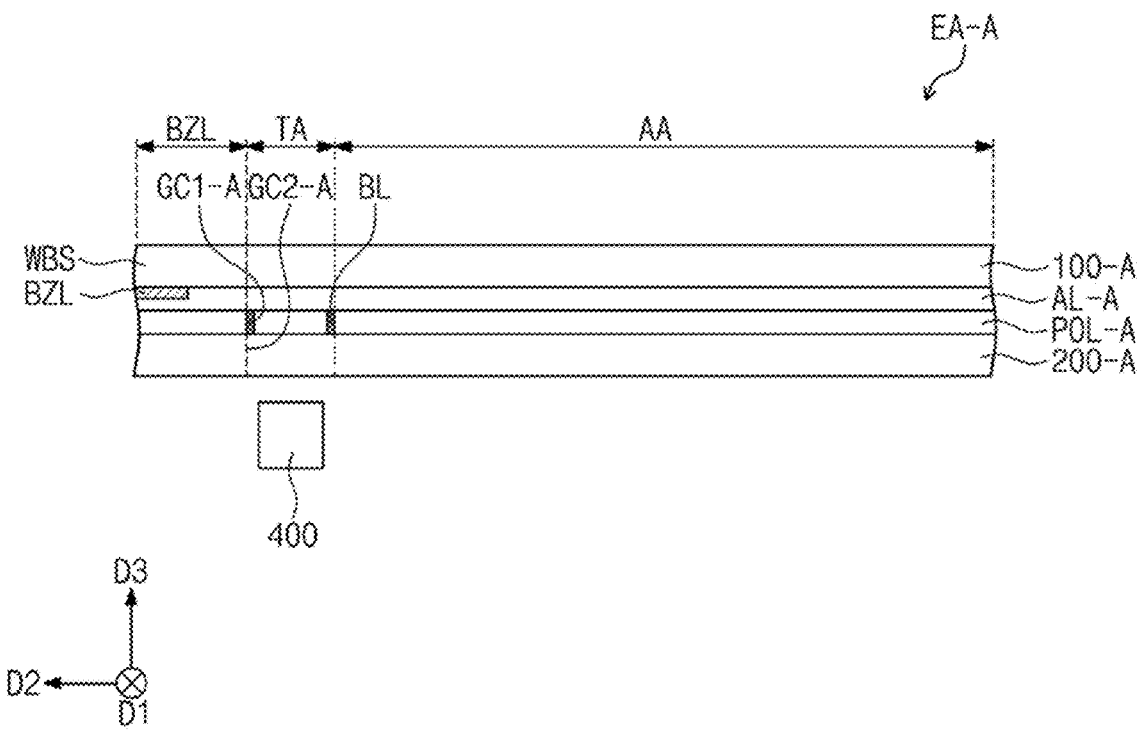
FIG. 8B is a cross-sectional view of one constituent of an electronic apparatus according to an embodiment of the inventive concept.
Figure 8C:
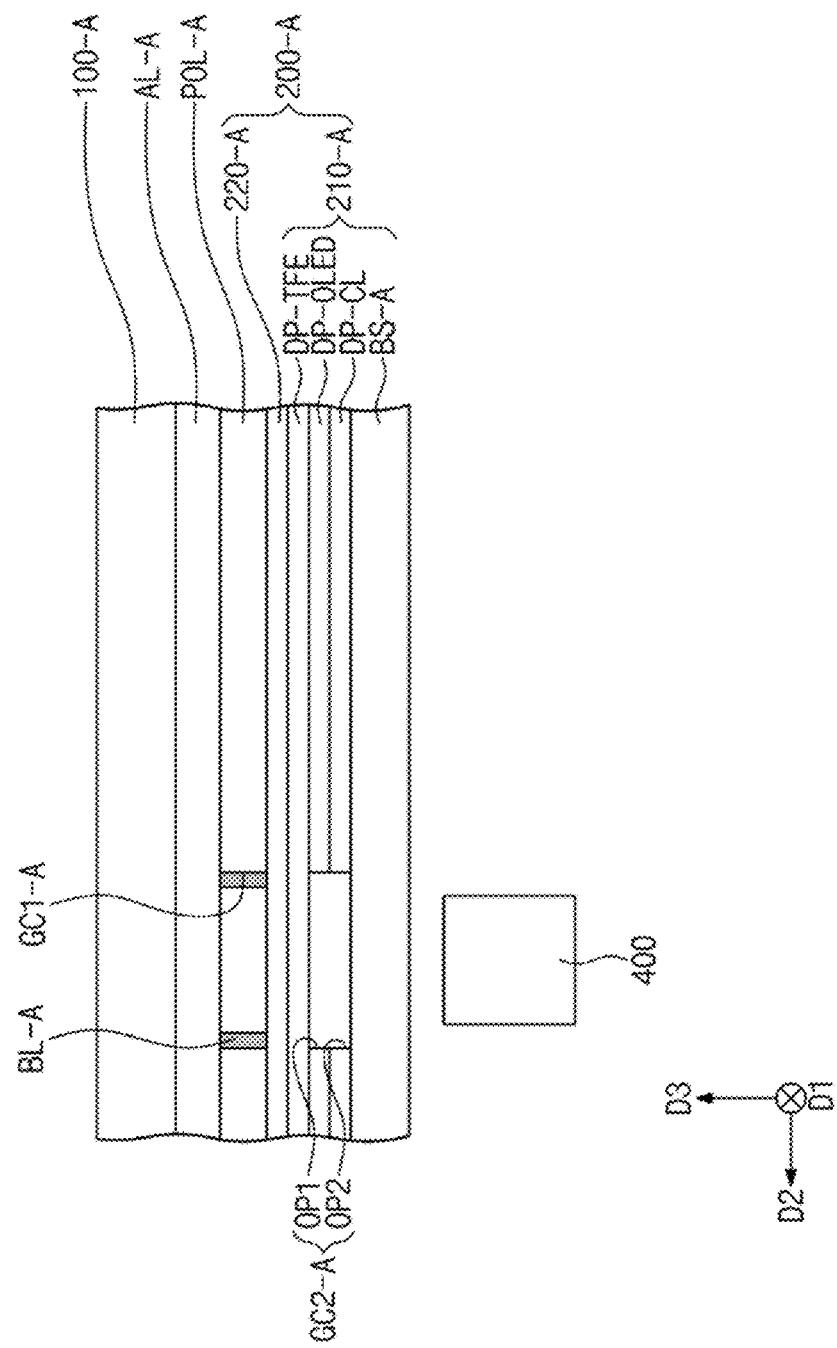
FIG. 8C is an enlarged cross-sectional view of one region of FIG. 8B.

FIG. 8A is an exploded perspective view of an electronic apparatus of FIG. 1A according to an embodiment of the inventive concept. FIG. 8B is a cross-sectional view of one constituent of an electronic apparatus according to an embodiment of the inventive concept. FIG. 8C is an enlarged cross-sectional view of one region of FIG. 8B. The same or similar reference numerals are used for the components as those of FIGS. 1A to 5, and thus, their duplicated descriptions will be omitted.

According to an embodiment, an electronic apparatus EA-A includes a window 100-A, an optical member POL-A in which a first opening GC1-A is formed, a cover pattern BL-A, a display module 200-A, a circuit board 300-A, an electronic module 400-A, and an external case 500-A.

Referring to FIG. 8A, according to an embodiment, unlike the display module 200-A of FIG. 1B, the display module 200-A shown in FIG. 8A does not include the second opening GC2 that passes through the display module 200-A, but rather a panel opening GC2-A having an area on which constituents of the display module 200-A are not deposited.

Referring to FIGS. 8B and 8C, in an embodiment, an electronic module 400-A is disposed that overlaps a transmission area TA of the window 100-A. The first opening GC1-A is formed in the optical member POL-A in an area that overlaps the electronic module 400-A. In an embodiment, a cover pattern BL-A is disposed only in the first opening GC-A.

According to an embodiment, the display module 200-A includes a display panel 210-A and a sensing sensor 220-A. The display panel 210-A includes a base substrate BS-A, a circuit element layer DP-CL, a display element layer DP-OLED, and an encapsulation layer DP-TFE. In addition, the encapsulation layer DP-TFE is a separate substrate attached by a sealant that surrounds an edge of the base substrate BS-A. Thus, a gap occurs between the base substrate BS-A and the encapsulation layer DP-TFE.

According to an embodiment, in the display module 200-A, an opening GCA2-A that overlaps the electronic module 400-A is formed by the non-deposition of the constituents disposed in the display module 200-A. For example, in the display element layer DP-OLED, a display opening OP is formed by the non-deposition of the organic layer EL in an area that overlaps the electronic module 400-A. A circuit opening OP2 is formed by the non-deposition of the thin film transistor TR in the area of the circuit element layer DP-CL that overlaps the electronic module 400-A.

According to an embodiment, the display opening OP and the circuit opening OP2 are be covered by a base substrate BS-A and an encapsulation layer DP-TFE. Therefore, a portion of the encapsulation layer DP-TFE overlaps the display opening OP1 and the circuit opening OP2. In this embodiment, the display opening OP1 and the circuit opening OP2 are aligned and correspond to the panel opening GC2-A.

According to an embodiment, the display opening OP and the circuit opening OP2 may be an empty space or may have a configuration that includes a light transmitting filling material, but embodiments are not limited thereto.

According to an embodiment, the panel opening GC2-A, has a higher light transmittance than other areas of the display module 200-A. Therefore, even if the electronic module 400-A is disposed in the transmission area TA, a loss of light transmitted through the panel opening GC2-A to the electronic module 400-A or light transmitted out from the electronic module 400-A through the panel opening GC2-A is reduced. Accordingly, the electronic apparatus EA-A has improved reliability.

FIGS. 9A to 9D are plan views of one constituent of an electronic apparatus according to an embodiment of the inventive concept. The same or similar reference numerals are used for the components as those of FIGS. 1A to 5, and thus, their duplicated descriptions will be omitted.

According to an embodiment, each of openings described with reference to FIGS. 9A to 9D has a constituent that corresponds to at least one of the openings GC1 and GC2 described with reference to FIG. 1B.

Figure 9A:
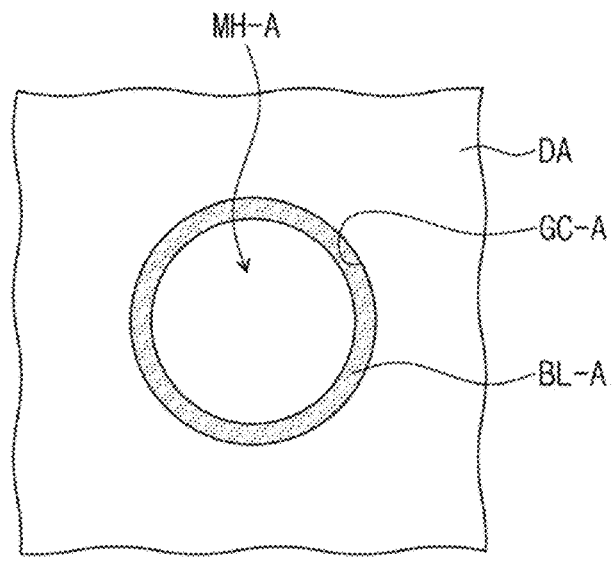
FIGS. 9A to 9D are plan views of one constituent of an electronic apparatus according to an embodiment of the inventive concept.

Referring to FIG. 9A, an opening GC-A according to an embodiment has a circular shape on the plane. Thus, a cover pattern BL-A disposed on an inner surface of the opening GC-A also has a circular shape.

Figure 9B:
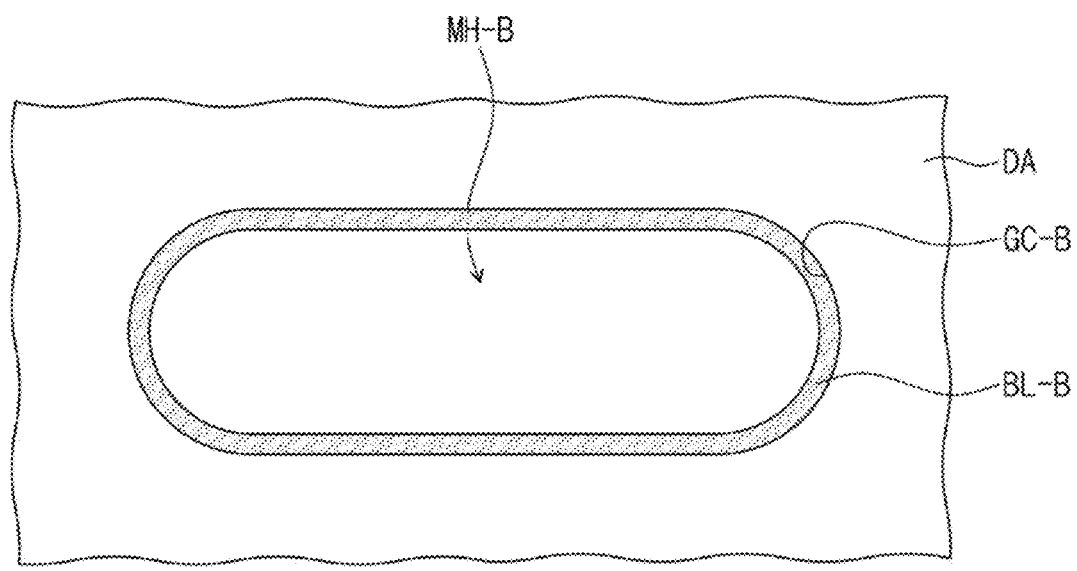

Referring to FIG. 9B, an opening GC-B according to an embodiment has an oval shape on the plane. Thus, a cover pattern BL-B disposed on an inner surface of the opening GC-B also has an oval shape.

Figure 9C:
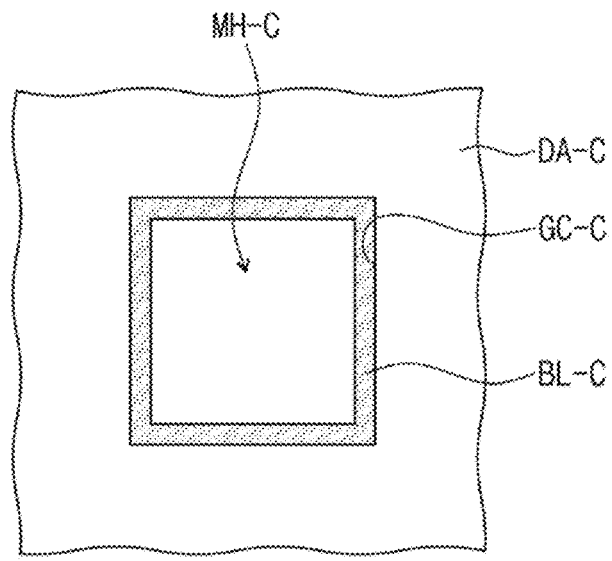

Referring to FIG. 9C, an opening GC-C according to an embodiment has a polygonal shape on the plane. Thus, a cover pattern BL-C disposed on an inner surface of the opening GC-C also has a polygonal shape. In FIG. 9C, the opening portion GC-C is illustrated as having a rectangular shape, but embodiments are not limited thereto.

Figure 9D:
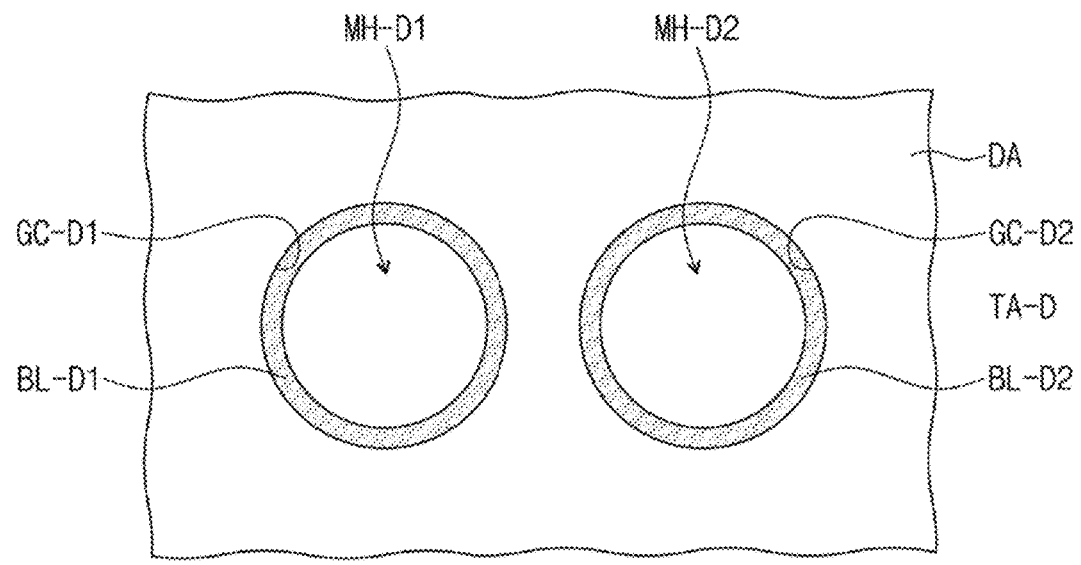

Referring to FIG. 9D, according to an embodiment, a plurality of the openings and cover patterns corresponding thereto are provided. For example, a first cover pattern BL-D1 and a second cover pattern BL-D2 are provided that respectively include a first opening portion GC-D1 and a second opening portion GC-D2 spaced apart from each other, and are respectively disposed on inner surfaces thereof.

FIGS. 10A to 10E are cross-sectional views that illustrate a method for manufacturing an electronic apparatus according to an embodiment of the inventive concept. The same or similar reference numerals are used for the components as those of FIGS. 1A to 5, and thus, their duplicated descriptions will be omitted.

Figure 10A:
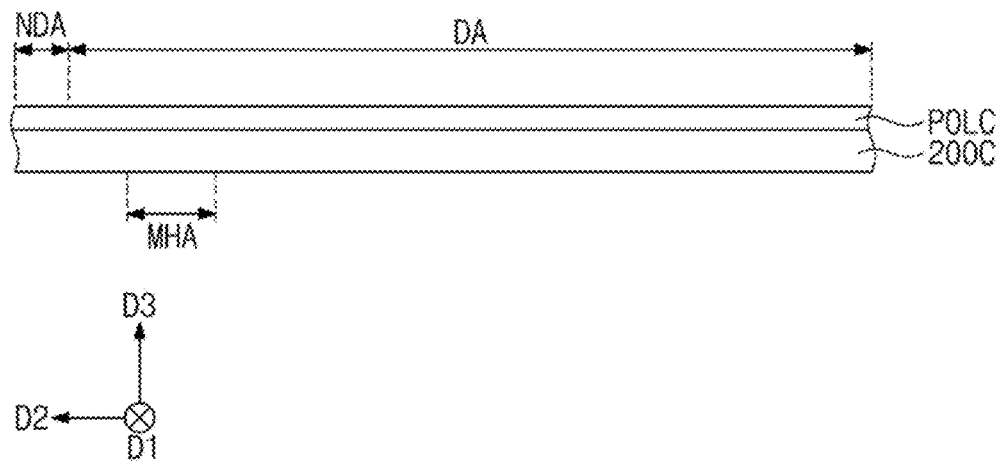

Referring to FIG. 10A, a method for manufacturing an electronic apparatus according to an embodiment includes a process of providing a preliminary display module 200C and a preliminary optical member POLC.

According to an embodiment, the preliminary display module 200C refers to a state before the second opening GC2 is formed in the display module 200 of FIG. 4. Similarly, the preliminary optical member POLC refers to a state before the first opening GC1 is formed in the optical member POL of FIG. 1B. The preliminary display module 200C includes a module hole area MHA in which the electronic module 400 can be disposed.

Figure 10B:
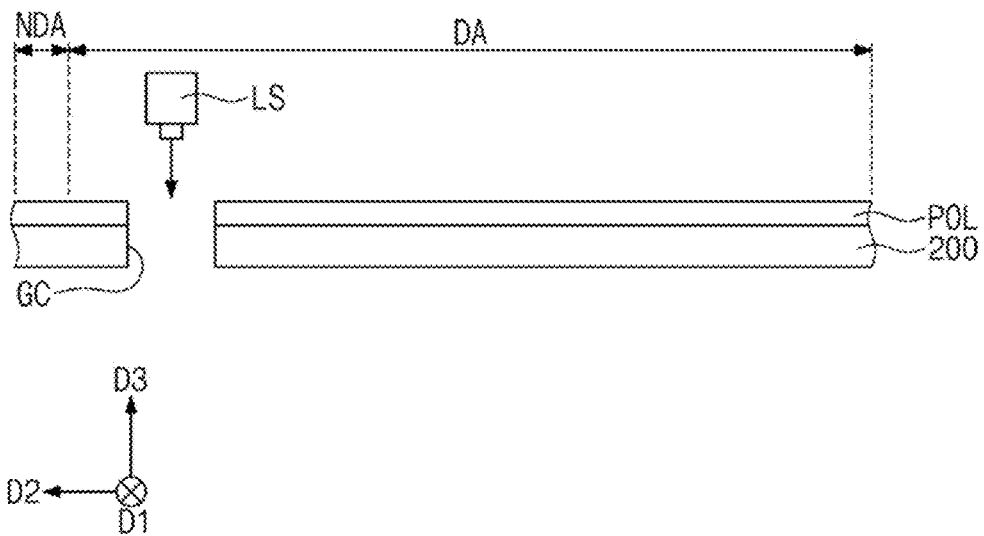

Thereafter, according to an embodiment, referring to FIG. 10B, a method for manufacturing an electronic apparatus according to an embodiment includes a process of forming a display module 200 and an optical member POL.

According to an embodiment, the process of forming the display module 200 and the optical member POL is performed by irradiating a laser LS onto a portion of the preliminary optical member POLC that overlaps a hole area MHA to form an opening GC. An area onto which the laser LS is irradiated is where the electronic module 400 will be disposed.

Figure 10C:
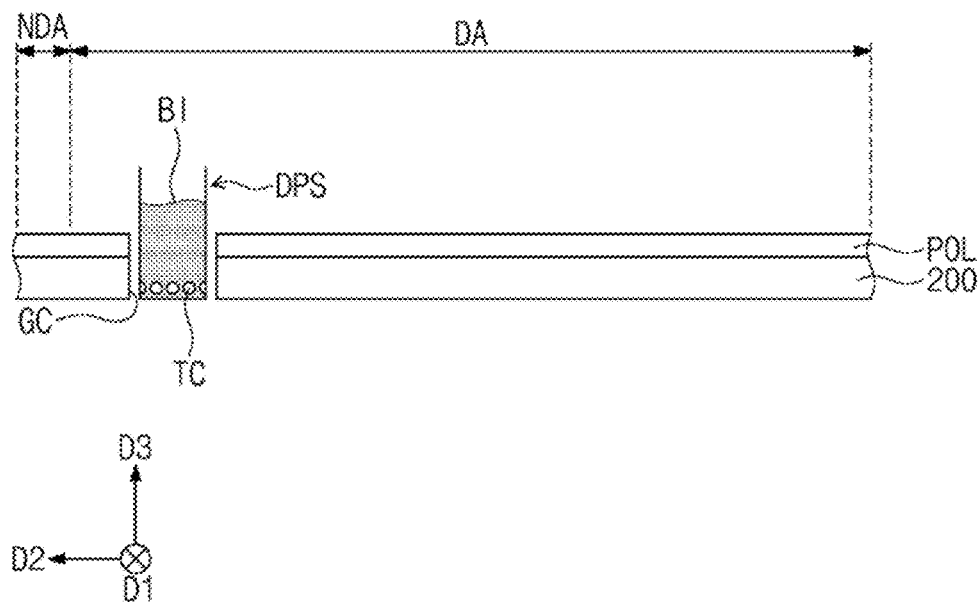
Figure 10D:
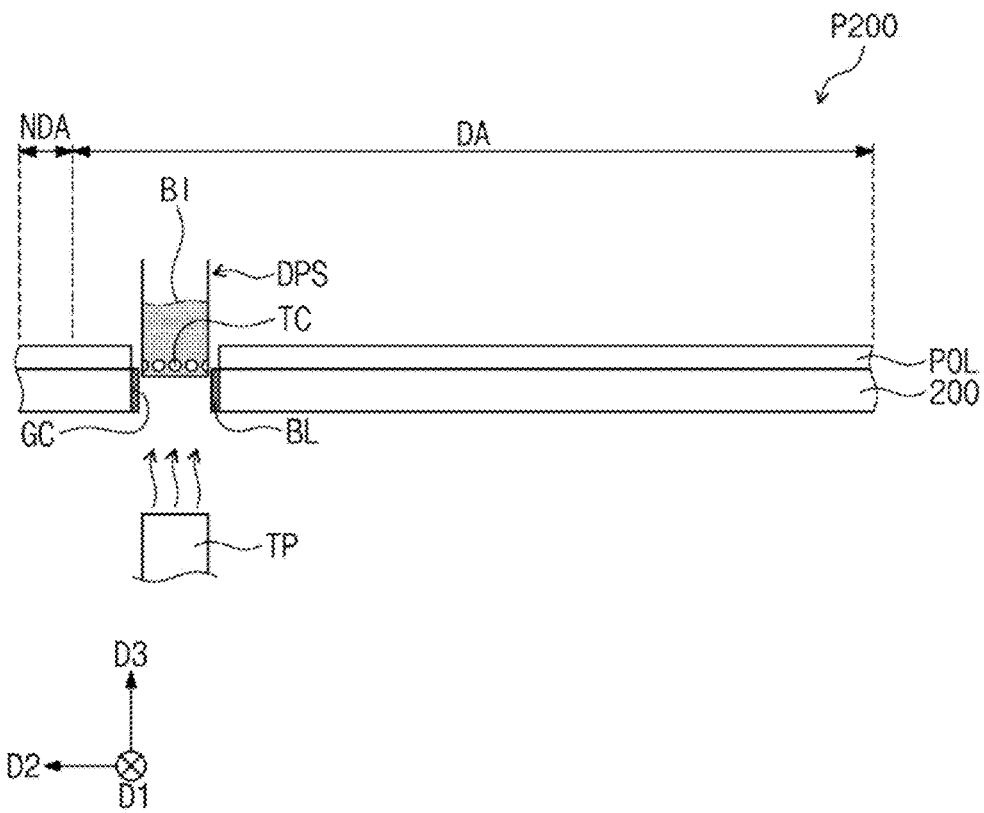

Thereafter, according to an embodiment, referring to FIGS. 10C and 10D, a method for manufacturing an electronic apparatus according to an embodiment includes a process of forming a cover pattern.

According to an embodiment, the process of forming the cover pattern BL includes a process of discharging a light blocking material BI onto an inner surface of the opening GC and a process of curing the light blocking material BI.

According to an embodiment, the process of discharging the light blocking material BI is performed using a dispenser DPS that accommodates the light blocking material BI and that includes discharge holes TC through which the light blocking material B1 is discharged. The process of discharging the light blocking material BI is performed by applying the light blocking material BI to the inner surface of the opening GC through the discharge holes TC while the dispenser DPS with the light blocking material BI moves from the display module 200 in a direction toward the optical member POL.

According to an embodiment, the process of curing the light blocking material BI is performed using a curing device TP disposed under the display module 200.

Figure 10E:
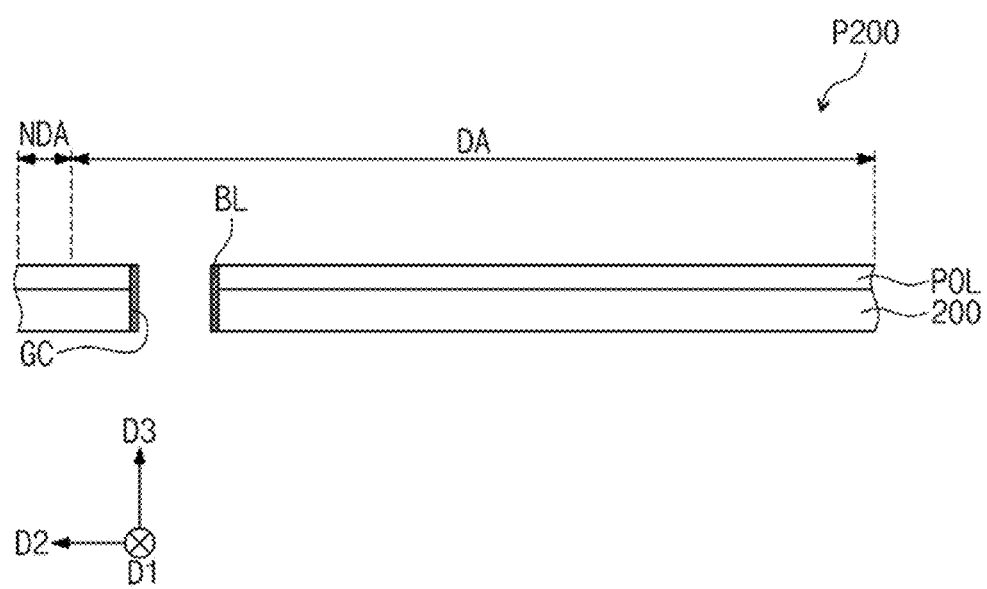

According to an embodiment of the inventive concept, the light blocking material BI is applied to the inner surface of the opening GC while the dispenser DPS moves, and simultaneously, the light blocking material B1 applied to the inner surface of the opening GC is cured by the curing device TP. FIG. 10E shows a display module P200 after light blocking material BI has been applied to the inner surface of the opening GC to form the cover pattern BL.

According to an embodiment of the inventive concept, since the cover pattern is disposed in the inner surfaces of the opening that overlaps the electronic module, the cover pattern is provided in a relatively narrow area as compared to a structure in which the cover pattern is directly disposed on the rear surface of the window. Therefore, the electronic apparatus has improved visibility.

It will be apparent to those skilled in the art that various modifications and variations can be made to embodiments of the inventive concept. Thus, it is intended that embodiments of the present disclosure cover the modifications and variations of exemplary embodiments provided they come within the scope of the appended claims and their equivalents.

Hence, the real protective scope of embodiments of the inventive concept shall be determined by the technical scope of the accompanying claims.

What is claimed is:

1. An electronic apparatus, comprising:
    a window;
    a display module that includes a module hole;
    an optical member disposed between the window and the display module and in which a first opening that overlaps the module hole is formed; and
    a cover pattern disposed on an inner surface of the first opening of the optical member.

2. The electronic apparatus of claim 1, wherein the display module comprises:
    a base substrate;
    a circuit element layer disposed on the base substrate, wherein the circuit element layer includes a transistor;
    a display element layer disposed on the circuit element layer, wherein the display element layer includes a light emitting element connected to the transistor;
    an encapsulation layer that covers the display element layer; and
    a sensing sensor disposed on the encapsulation layer, wherein the sensing sensor includes sensing electrodes spaced apart from each other.

3. The electronic apparatus of claim 2, wherein the module hole is formed by a second opening that passes through the display module.

4. The electronic apparatus of claim 3, wherein the cover pattern covers an inner surface of the second opening of the display module.

5. The electronic apparatus of claim 3, wherein the cover pattern is not disposed on an inner surface of the second opening of the display module.

6. The electronic apparatus of claim 2, wherein a panel opening that passes through at least one of the circuit element layer or the display element layer is formed in the display module,
the module hole is formed by the panel opening, and
the encapsulation layer overlaps the panel opening.

7. The electronic apparatus of claim 1, further comprising an adhesion layer disposed between the window and the optical member.

8. The electronic apparatus of claim 7, wherein a third opening that overlaps the module hole and passes through the adhesion layer is formed in the adhesion layer, and
the cover pattern extends to an inner surface of the third opening of the adhesion layer.

9. The electronic apparatus of claim 7, wherein the window comprises a base window and a bezel pattern,
the base window comprises a bezel area on which the bezel pattern is disposed, a transmission area that overlaps the module hole, and an active area that surrounds the transmission area and is adjacent to the bezel area, and
the active area transmits therethrough an image generated in the display module.

10. The electronic apparatus of claim 9, wherein the adhesion layer contacts the base window in the transmission area and the active area, and
the adhesion layer contacts the bezel pattern in the bezel area.

11. The electronic apparatus of claim 1, wherein a plurality of first openings and cover patterns are provided.

12. An electronic apparatus, comprising:
a window;
an optical member disposed below the window and in which a first opening is formed;
a display module disposed below the optical member and in which a second opening that overlaps the first opening is formed; and
a cover pattern disposed on at least one of a first inner surface of the first opening of the optical member or a second inner surface of the second opening of the display module.

13. The electronic apparatus of claim 12, further comprising an adhesion layer disposed between the window and the optical member.

14. The electronic apparatus of claim 13, wherein a third opening that overlapping the second opening and passes through the adhesion layer is formed in the adhesion layer, and
the cover pattern extends to an inner surface of the third opening of the adhesion layer.

15. The electronic apparatus of claim 13, wherein the window comprises a base window and a bezel pattern,
the base window includes a bezel area on which the bezel pattern is disposed, a transmission area that overlaps the first opening, and an active area that surrounds the transmission area and is adjacent to the bezel area, and
the active area transmits therethrough an image generated in the display module.

16. The electronic apparatus of claim 15, wherein the adhesion layer contacts the base window in the transmission area and the active area, and
the adhesion layer contacts the bezel pattern in the bezel area.

17. The electronic apparatus of claim 12 wherein the cover pattern has one of a circular shape, an oval shape, or a polygonal shape.

18. The electronic apparatus of claim 12 wherein the cover pattern is black.

* * * * *